US011935618B2

(12) United States Patent
Yap et al.

(10) Patent No.: US 11,935,618 B2
(45) Date of Patent: Mar. 19, 2024

(54) AREA-EFFICIENT CONFIGURATION LATCH FOR PROGRAMMABLE LOGIC DEVICE

(71) Applicant: QuickLogic Corporation, San Jose, CA (US)

(72) Inventors: Ket Chong Yap, San Jose, CA (US); Chihhung Liao, Fremont, CA (US); Shieh Huan Yen, New Taipei (TW)

(73) Assignee: QUICKLOGIC CORPORATION, San Jose, CA (US)

( * ) Notice: Subject to any disclaimer, the term of this patent is extended or adjusted under 35 U.S.C. 154(b) by 162 days.

(21) Appl. No.: 17/725,564

(22) Filed: Apr. 21, 2022

(65) Prior Publication Data

US 2023/0343372 A1    Oct. 26, 2023

(51) Int. Cl.
*G11C 7/00*        (2006.01)
*G11C 7/10*        (2006.01)
*G11C 7/12*        (2006.01)
*G11C 8/08*        (2006.01)
*H03K 19/017*      (2006.01)

(52) U.S. Cl.
CPC .......... *G11C 7/1039* (2013.01); *G11C 7/1069* (2013.01); *G11C 7/1096* (2013.01); *G11C 7/12* (2013.01); *G11C 8/08* (2013.01); *H03K 19/01742* (2013.01)

(58) Field of Classification Search
CPC ..................................... G11C 7/1039
USPC .................................. 365/189.011
See application file for complete search history.

(56) References Cited

U.S. PATENT DOCUMENTS 9,130,563 B1 * 9/2015 Jami .................. H03K 19/0948

* cited by examiner

*Primary Examiner* — Hoai V Ho
(74) *Attorney, Agent, or Firm* — Seed IP Law Group LLP

(57) ABSTRACT

An area efficient input terminated readable and resettable configuration memory latch is disclosed. A pull-up network and a pair of pull-down networks operate to set the value of an internal node based, in part, on the state of the input terminated bit line and a word line write input. The internal node is inverted to form the output of the configuration memory latch. A reset line operates to reset the latch and a reset cycle is initiated prior to each write cycle. In some embodiments, the configuration memory latch includes a scan mode input, which, when asserted, facilitates automated testing of a programmable logic device that includes the configuration memory latch. Asserting the scan mode input enables Design for Test functionality. A sensing block is configured to sense the state of the bit when a word line read signal and a read enable signal are both asserted.

20 Claims, 11 Drawing Sheets

AREA-EFFICIENT CONFIGURATION LATCH FOR PROGRAMMABLE LOGIC DEVICE

TECHNICAL FIELD

The present invention relates to an integrated circuit that includes a programmable logic device (PLD), such as a field programmable gate array (FPGA) and to an area-efficient configuration memory latch for PLDs.

BACKGROUND

The semiconductor industry is driven by a desire to provide higher levels of integration. With higher levels of integration, silicon space and cost are reduced while performance and reliability are increased. Unfortunately, higher levels of integration lead to greater specificity. For example, application specific integrated circuits (ASICs) are highly specific devices that often serve the needs of very specific customers.

Programmable logic devices, such as field programmable gate arrays (FPGAs), are versatile integrated circuit chips, which have internal circuitry logic with user selected connections that a user can configure to realize user-specific functions. While programmable logic is versatile, there can be significant design challenges related to incorporating desired logic for a specified die size, routing signals, signal stability, etc. when large complex functions are mapped onto a silicon platform that includes programmable logic.

For example, FPGAs may use storage elements when routing through multiplexers ("muxes") or when defining a function via a look up table. Conventionally, the storage elements used are Static Random Access Memory (SRAM) cells, or registers. SRAM cells may be distributed throughout the design and may take the form of an array. SRAM cells may be used to program FPGA routing interconnects and configurable logic blocks (CLBs) that are used to implement logic functions. While SRAM cells can be area-efficient, they are very foundry and process dependent and can cause considerable difficulties when migrating the FPGA product to a different process or a different foundry. On the other hand, while registers are available and can be implemented using standard cell libraries—they are not area efficient.

Conventionally, latches, which are much more area-efficient relative to registers, are not used as storage elements, in part, because of difficulties that can arise with the reading of latches.

Some disclosed embodiments enable the use of latches as storage elements thereby facilitating standardized area-efficient FPGA design.

SUMMARY

Some disclosed embodiments pertain to a configuration memory latch circuit comprising: a first pMOS transistor, wherein a first pMOS source of the first pMOS transistor is coupled to a supply voltage and the first pMOS transistor drain is coupled to a first node; a first pull-down network comprising a first nMOS transistor in series with a second nMOS transistor, wherein the first nMOS transistor source is coupled to ground (GND) and the second nMOS transistor drain is coupled to the first node; a second pull down network in parallel with the first pull-down network, wherein the second pull-down network comprises a third nMOS transistor in series with a fourth nMOS transistor, wherein the third nMOS transistor source is coupled to the ground wherein the fourth nMOS transistor drain is coupled to the first node; a first pull up network, wherein the first pull up network comprises a second pMOS transistor, a third pMOS transistor, and a fourth pMOS transistor, wherein: the second pMOS transistor drain is coupled to the first node, the third pMOS transistor drain and the fourth pMOS transistor drain are both coupled to the second pMOS transistor source, and the third pMOS transistor source and the fourth pMOS transistor source are both coupled to the supply voltage; an input reset line coupled to the first pMOS transistor gate and to the first nMOS transistor gate, wherein the reset line is active low; a first inverter, wherein the input of the first inverter is coupled to the first node, and the output of the first inverter is coupled to the second pMOS transistor gate and to the second nMOS transistor gate; a bit line (BL) signal to input a first data to be written into the configuration memory latch during write operations, wherein the BL is coupled to the third pMOS transistor gate and to the third nMOS transistor gate, an input Word Line Write (WLW) signal, which, when asserted, enables data to be written to the configuration memory latch, wherein the WLW signal is coupled to the fourth pMOS transistor gate and to the fourth nMOS transistor gate; and a second inverter, wherein the input of the second inverter is coupled to the first node, and the output of the second inverter drives an output line of the configuration memory latch. In some embodiments, a new reset cycle may be initiated prior to each assertion of WLW, wherein each reset cycle may comprise asserting reset followed by de-asserting reset.

Some disclosed embodiments also pertain to an integrated circuit (IC) comprising: a programmable logic device (PLD). The PLD may comprise a configuration memory latch, wherein the configuration memory latch may comprise: a first pMOS transistor, wherein a first pMOS source of the first pMOS transistor is coupled to a supply voltage and the first pMOS transistor drain is coupled to a first node; a first pull-down network comprising a first nMOS transistor in series with a second nMOS transistor, wherein the first nMOS transistor source is coupled to ground (GND) and the second nMOS transistor drain is coupled to the first node; a second pull down network in parallel with the first pull-down network, wherein the second pull-down network comprises a third nMOS transistor in series with a fourth nMOS transistor, wherein the third nMOS transistor source is coupled to the ground, wherein the fourth nMOS transistor drain is coupled to the first node; a first pull up network, wherein the first pull up network comprises a second pMOS transistor, a third pMOS transistor, and a fourth pMOS transistor, wherein: the second pMOS transistor drain is coupled to the first node, the third pMOS transistor drain and the fourth pMOS transistor drain are both coupled to the second pMOS transistor source, and the third pMOS transistor source and the fourth pMOS transistor source are both coupled to the supply voltage; an input reset line coupled to the first pMOS transistor gate and to the first nMOS transistor gate, wherein the reset line is active low; a first inverter, wherein the input of the first inverter is coupled to the first node, and the output of the first inverter is coupled to the second pMOS transistor gate and to the second nMOS transistor gate; a bit line (BL) signal to input a first data to be written into the configuration memory latch during write operations, wherein the BL is coupled to the third pMOS transistor gate and to the third nMOS transistor gate; an input Word Line Write (WLW) signal, which, when asserted, enables data to be written to the configuration memory latch, wherein the WLW signal is coupled to the fourth pMOS transistor gate and to the fourth nMOS transistor gate; and a second inverter, wherein the input of the second inverter is coupled to the first node, and the output of the second inverter drives an output line of the configuration memory latch. In some embodiments, a new reset cycle may be initiated prior to each assertion of WLW, wherein each reset cycle may comprise asserting reset followed by de-asserting reset.

In another aspect, a configuration memory latch circuit may comprise: (1) a first pMOS transistor, wherein a first pMOS source of the first pMOS transistor is coupled to $V_{DD}$ and a first pMOS drain of the first pMOS transistor is coupled to a first node; (2) a first pull-down network comprising a first nMOS transistor, a fifth nMOS transistor, and a second nMOS transistor in series, wherein the first nMOS transistor source is coupled to ground (GND) and the first nMOS transistor drain is coupled to the fifth nMOS transistor source, and wherein the fifth nMOS transistor drain is coupled to the second nMOS transistor source and the second nMOS transistor drain is coupled to the first node; (3) a second pull down network in parallel with the first pull-down network, wherein the second pull-down network comprises a third nMOS transistor in series with a fourth nMOS transistor, wherein the third nMOS transistor source is coupled to ground, and the fourth nMOS transistor drain is coupled to the first node; (4) a first pull up network, wherein the first pull up network comprises a second pMOS transistor, a third pMOS transistor, a fourth pMOS transistor, and a fifth pMOS transistor, wherein: (a) the second pMOS transistor drain and the fifth pMOS transistor drain are both coupled to the first node, (b) the second pMOS transistor source and the fifth pMOS transistor source are each coupled to: (i) the third pMOS transistor drain and (ii) the fourth pMOS transistor drain, and (c) the third pMOS transistor source and the fourth pMOS transistor source are both coupled to the supply voltage; (5) an input reset line coupled to the first pMOS transistor gate and to the first nMOS transistor gate, wherein the reset line is active low; (6) a first inverter, wherein the input of the first inverter is coupled to the first node Q, and the output of the first inverter is coupled to the second pMOS transistor gate and to the second nMOS transistor gate; (7) a bit line (BL) signal to input a first data to be written into the configuration memory latch during write operations, wherein the BL is coupled to the third pMOS transistor gate and to the third nMOS transistor gate, and, wherein a state of the BL, during read operations, is indicative of a data stored in the configuration memory latch; (8) an input Word Line Write (WLW) signal, which, when asserted, enables data to be written to the configuration memory latch, wherein the WLW signal is coupled to the fourth pMOS transistor gate and to the fourth nMOS transistor gate; (9) a scan mode input, wherein the scan mode input is active low, and wherein the scan mode input is coupled to the fifth pMOS transistor gate and to the fifth nMOS transistor gate, wherein the scan mode input is asserted to place the configuration memory latch in test mode; and (10) a second inverter, wherein the input of the second inverter is coupled to the first node, and the output of the second inverter drives an output line of the configuration memory latch. In some embodiments, in the configuration memory latch circuit, in non-test mode with scan mode de-asserted, a new reset cycle may be initiated prior to each assertion of WLW, wherein each reset cycle may comprise asserting reset followed by de-asserting reset.

In a further aspect, an integrated circuit (IC) may comprise a programmable logic device (PLD), wherein the PLD may comprises a configuration memory latch. In some embodiments, the configuration memory latch may comprise: (1) a first pMOS transistor, wherein a first pMOS source of the first pMOS transistor is coupled to $V_{DD}$ and a first pMOS drain of the first pMOS transistor is coupled to a first node; (2) a first pull-down network comprising a first nMOS transistor, a fifth nMOS transistor, and a second nMOS transistor in series, wherein the first nMOS transistor source is coupled to ground (GND) and the first nMOS transistor drain is coupled to the fifth nMOS transistor source, and wherein the fifth nMOS transistor drain is coupled to the second nMOS transistor source and the second nMOS transistor drain is coupled to the first node; (3) a second pull down network in parallel with the first pull-down network, wherein the second pull-down network comprises a third nMOS transistor in series with a fourth nMOS transistor, wherein the third nMOS transistor source is coupled to ground, and the fourth nMOS transistor drain is coupled to the first node; (4) a first pull up network, wherein the first pull up network comprises a second pMOS transistor, a third pMOS transistor, a fourth pMOS transistor, and a fifth pMOS transistor, wherein: (a) the second pMOS transistor drain and the fifth pMOS transistor drain are both coupled to the first node, (b) the second pMOS transistor source and the fifth pMOS transistor source are each coupled to: (i) the third pMOS transistor drain and (ii) the fourth pMOS transistor drain, and (c) the third pMOS transistor source and the fourth pMOS transistor source are both coupled to the supply voltage; (5) an input reset line coupled to the first pMOS transistor gate and to the first nMOS transistor gate, wherein the reset line is active low; (6) a first inverter, wherein the input of the first inverter is coupled to the first node Q, and the output of the first inverter is coupled to the second pMOS transistor gate and to the second nMOS transistor gate; (7) a bit line (BL) signal to input a first data to be written into the configuration memory latch during write operations, wherein the BL is coupled to the third pMOS transistor gate and to the third nMOS transistor gate, and, wherein a state of the BL, during read operations, is indicative of a data stored in the configuration memory latch; (8) an input Word Line Write (WLW) signal, which, when asserted, enables data to be written to the configuration memory latch, wherein the WLW signal is coupled to the fourth pMOS transistor gate and to the fourth nMOS transistor gate; (9) a scan mode input, wherein the scan mode input is active low, and wherein the scan mode input is coupled to the fifth pMOS transistor gate and to the fifth nMOS transistor gate, wherein the scan mode input is asserted to place the configuration memory latch in test mode; and (10) a second inverter, wherein the input of the second inverter is coupled to the first node, and the output of the second inverter drives an output line of the configuration memory latch. In some embodiments, in the configuration memory latch circuit, in non-test mode with scan mode de-asserted, a new reset cycle may be initiated prior to each assertion of WLW, wherein each reset cycle may comprise asserting reset followed by de-asserting reset.

Like reference numbers and symbols in the various figures indicate like elements, in accordance with certain example embodiments. In addition, multiple instances of a functional element may be indicated by following a first number for the element with a letter or with a hyphen and a second number. For example, multiple instances of an element 440 may be indicated as 440-1, 440-2, 440-3 etc. In some instances, the suffixes may refer to the same element but in a different state and/or at a different time and/or associated with multiple other elements. When referring to such an element using only the first number, any instance of the element is to be understood (e.g. element 440 in the previous example would refer to elements 440-1, 440-2, and/or 440-3).

DETAILED DESCRIPTION

In the description, the terms, 1, "1", "one", "high", "logic 1", "logic one", and "logic high" refer to logic signal levels that are above some threshold voltage and sensed by logic circuitry to be a Boolean 1, whereas the terms 0, "0", "zero", "low", "logic zero", "logic 0", "and "logic low" refer to logic signal levels that are below some threshold voltage and sensed by logic circuitry to be a Boolean 0. The term "asserted" refers to an activation of a signal (e.g., the signal is interpreted as being true without regard to the logic level of the signal in question), whereas the term "de-asserted" refers to an inactivation of a signal (e.g., the signal is interpreted as being false regardless of logic level of the signal in question).

Figure 1A:
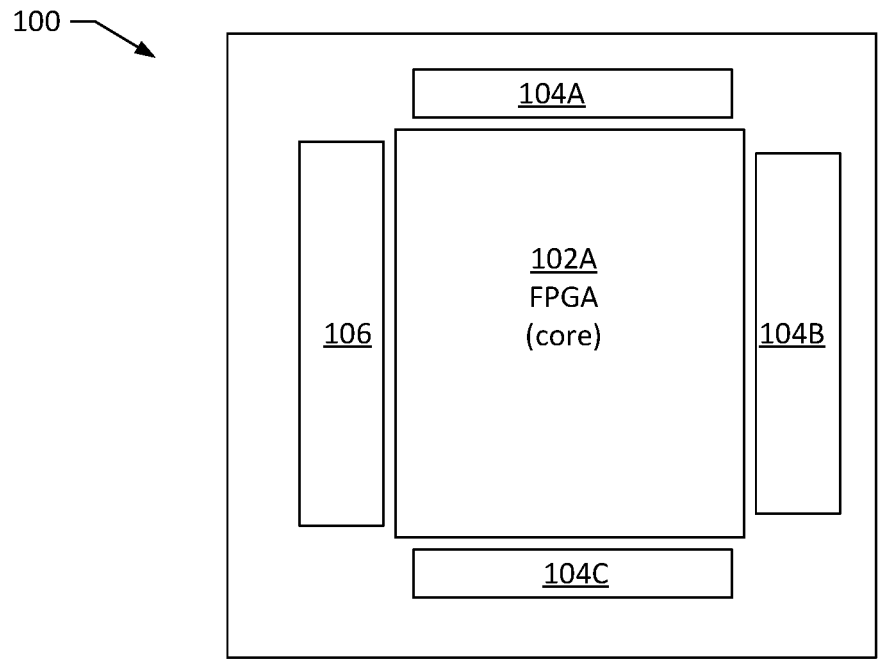
FIGS. 1A and 1B show simplified block diagrams of example Integrated Circuit (IC) chip that may include programmable logic devices (PLD) such as a field programmable gate array (FPGA) or other circuitry having user programmable circuit connections.
Figure 1B:
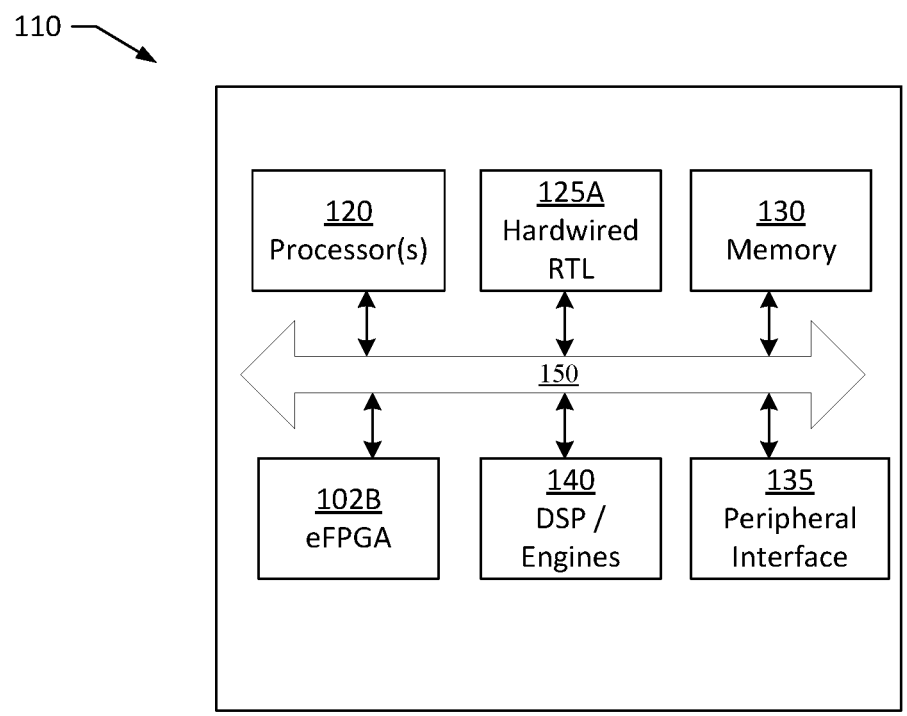

FIGS. 1A and 1B show simplified block diagrams of example Integrated Circuit (IC) chip 100 that may include programmable logic devices (PLD) 102 such as a field programmable gate array (FPGA) (e.g., 102A or 102B), and/or other circuitry having user programmable circuit connections. For simplicity and ease of description, the term "FPGA" may refer to any programmable logic device. Accordingly, while a programmable logic device described herein may be referred to as FPGA 102, it should be understood that other alternative types of programmable logic devices may also be used, such as Simple PLDs (SPLDs), Complex PLDs (CPLDs), Programmable Array Logic (PAL), etc.

As used herein, FPGA 102 may be a standalone FPGA 102A and/or take the form of an embedded FPGA (eFPGA) 102B. eFPGAs 102B may be viewed as fully integrated programmable logic Intellectual Property (IP) cores that form part of an ASIC or a System on a Chip (SoC). The term IP core refers to a reusable unit of logic, cell, circuit, or design element. IP cores are often licensed by an owning entity to another entity as a turnkey solution that provides some desired functionality. ASIC and/or SoCs with eFPGAs increase flexibility by facilitating combination of circuit/logic elements that that can be updated (e.g., associated with the eFPGA) with other elements of the ASIC/SoC.

As shown in FIG. 1A, a standalone Integrated Circuit (IC) chip 100 may include an FPGA core 102A. FPGA core 102A may be coupled to General Purpose Input/Output (GPIO) blocks 104 (shown as 104A, 104B, and 104C in FIG. 1A) and to one or more specific or dedicated interface blocks 106 (e.g., PCI Express, Ethernet, etc.). A standalone FPGA in the form of IC 100 may include various other blocks and/or logic/circuit elements (not shown in FIG. 1A) and may be coupled to other components on a circuit board using pins on IC 100.

FIG. 1B shows another example IC 110, which may include eFPGA 102B. IC 110 may be an ASIC or SoC and may include one or more processors (and/or processor cores) 120, hardwired register-transfer level (RTL) blocks, memory 130, Digital Signal Processor (DSP)/Engines block 140, and peripheral interface(s) 135. The blocks shown in FIG. 1B may be coupled using bus 150. For example, processor 120 and DSP/Engines block 140 may implement various application specific functions and additional customizations may be added using eFPGA 102B. In some embodiments, eFPGA 102 may be used to customize and/or accelerate machine learning applications, encryption schemes, etc., which may be implemented by Processor 120 and/or DSP/Engines block 140. As another example, eFPGA 102B may be used to implement and update functions or algorithms in the field (e.g., on deployed systems), or to address different markets (e.g., where each market may have one or more distinct requirements) using the same device (e.g., IC 110). Advantageously, integrated circuit 110, which incorporates eFPGA 102B, may provide a user with the functionality, ease-of-use, and high performance found in a dedicated device, such as an ASIC, as well as the configurability and flexibility found in programmable logic.

Figure 2A:
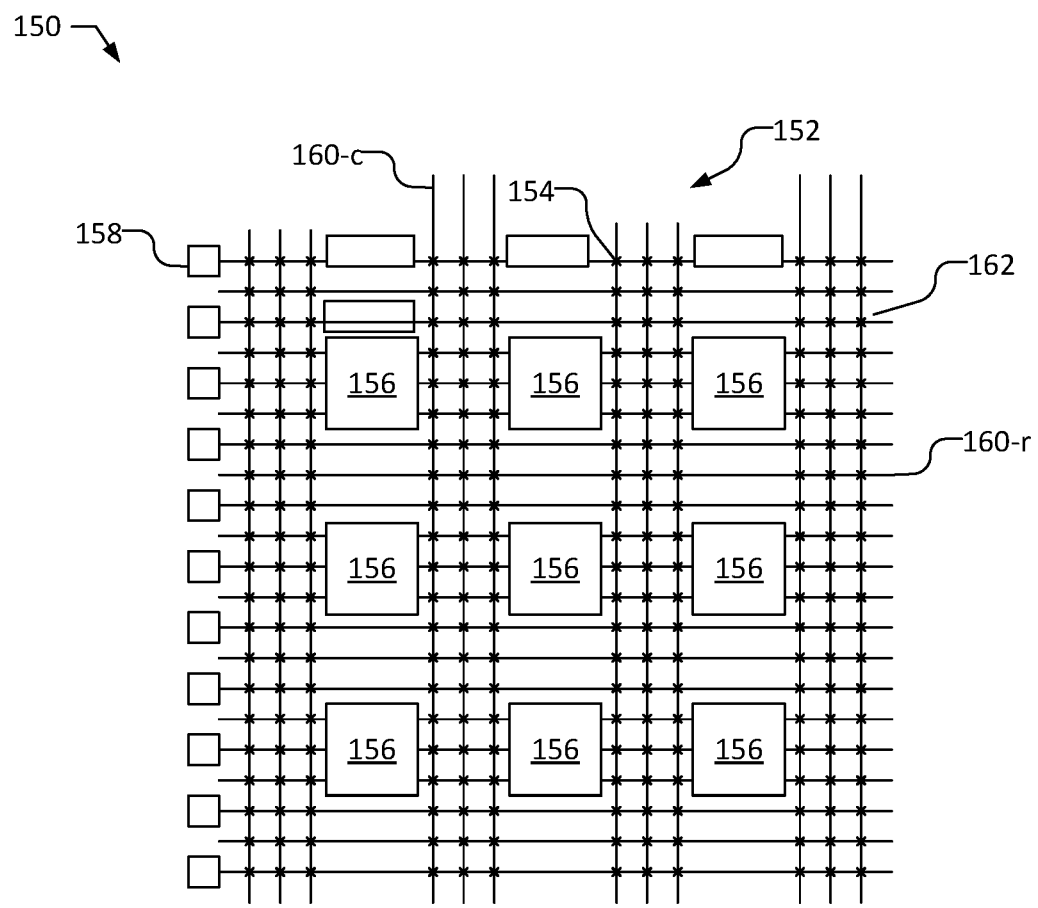
FIGS. 2A and 2B illustrate simplified schematics of a PLD in the form of an FPGA device such as the devices shown in FIGS. 1A and 1B.
Figure 2B:
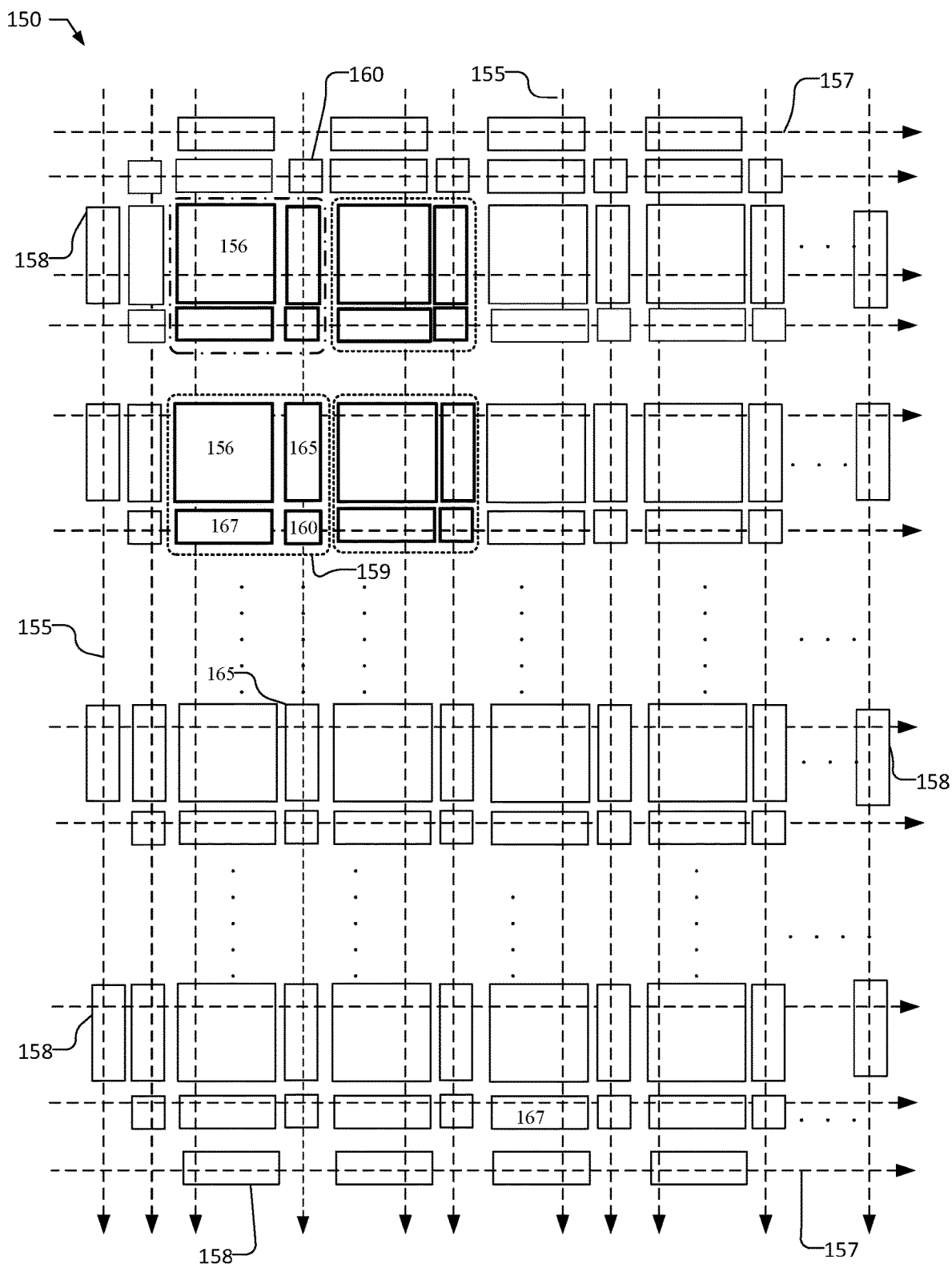

FIGS. 2A and 2B illustrate a simplified schematic of a PLD 150 in the form of an FPGA device (such as device 102A or 102B of FIG. 1A or 1B). FPGA device 150 may include an array 152 of programmable elements and conductors 160. In some instances, SRAM, antifuses, registers, or D-Latches 162, (shown marked by "x" in FIG. 2A), may be used to selectively connect conductors (e.g., horizontal conductors 160-r) with other conductors (e.g., vertical conductors 160-c). In FIGS. 2A and 2B the terms "vertical" and "horizontal" and/or "rows" and "columns" are merely used herein to facilitate identification of described elements in reference to the figures.

The array 152 of programmable elements (FIG. 2A), which is sometimes referred to as a programmable fabric, or programmable routing fabric is connected to a number of configurable logic blocks (CLBs) 156. Each CLB 156 may include a number of look up tables (LUTs), which may be configurable and/or programmable logic elements, which can be selectively combined to perform a desired function through the appropriate interconnection of conductors (e.g., by using registers and/or D-latches 162). In some embodiments, the LUTs in CLBs 156 may be implemented using latches. Each configurable LUT may be used to emulate some combinational function so that when using the inputs of the combinational function as LUT address bits, the memory bit storing the value of the function for each particular input combination may be read at the output of the LUT. As one example, the output of the LUT may be coupled to a latch. A mux may select the latch output or register (sequential logic) or LUT output (combinational logic) as the output of CLB 156. The output of CLB 156 may be connected to programmable routing fabric 152.

Input/output (I/O) circuits 158 provide an interface to external circuitry, i.e., off-chip circuitry and may facilitate access to internal resources via pins.

FIG. 2B shows another simplified schematic of FPGA device 150 (such as 102A or 102B of FIG. 1A or 1B) illustrating some other FPGA device elements. In some embodiments, depending on the size of FPGA 150, each CLB 156 may include and/or be associated with a plurality of configuration memories (e.g., hundreds or thousands of configuration memories), which are distributed over a large silicon area. Thus, a reasonable sized FPGA 150 may include millions of configuration memory bits. The configuration memories may be accessed using BLs 155 and WLs 157.

Programmable routing resource 152 may include a routing resources CBX 167 in the horizontal direction and CBY 165 in the vertical direction. Programmable routing resource 152 may facilitate the configuration of programmable switches and wiring segments, which determines interconnection between CLBs 156. Switch block (SB) 160 provides interconnections between the horizontal and vertical wire segments and the connection block (e.g. CBX 167 and CBY 165) provides input to the CLB block 156.

A CLB 156 and the associated CBX 167, CBY 165, and SB 160 (which are shown enhanced in FIG. 2B) with are also referred to as a tile or logic tile 159 (shown within the dashed block). As outlined above, Input/Output (I/O) circuits 158 (also referred to as General Purpose Input Output (GPIO) 158) may provide an interface to external off-chip circuitry and facilitate access to internal resources via pins.

Typically, BLs 155 and WLs 157 are made of a metal wire with the driver located in the FPGA array and/or along the perimeter.

Figure 3A:
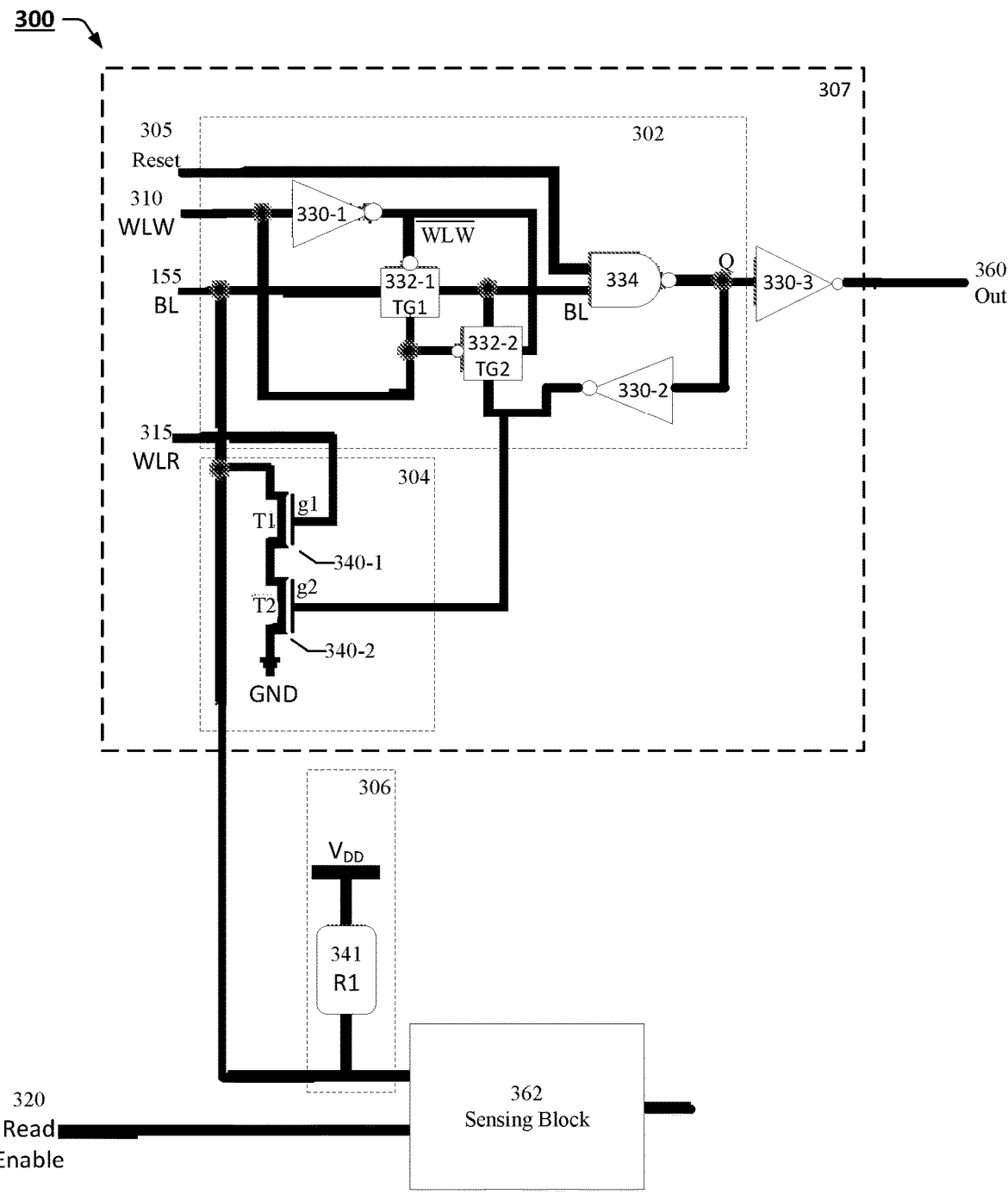
FIG. 3A shows a schematic of circuitry associated with a readable and resettable configuration latch with a non-terminated input.

FIG. 3A shows a schematic associated with an example readable and resettable configuration latch 300 with a non-terminated input. Configuration latch 300 is also referred to herein as configuration memory latch 300. In FIG. 3A, the outer dashed block 307 shows circuit elements that are repeated for each readable and resettable configuration memory latch (e.g., in one or more configuration memories), whereas circuit elements outside block 307 may be common to a plurality of configuration memory latches (in one or more configuration memories). For example, the circuitry in block 307 may be repeated for each configuration latch in a configuration memory and there may be a plurality of configuration memories coupled to BL 155. Further, as shown in FIG. 3A, a single pull-up 306 and a single sensing block 362 may be coupled to a BL 155. Thus, a single pull up 306 and a single sensing block 362 may be coupled to plurality of blocks 307. Therefore, it is understood, when referring to configuration latch 300, that a single pull up 306 and a single sensing block 362 coupled to a BL 155-$i$ may serve as a pull-up and a sensing block, respectively, for a plurality of blocks 307 (in one or more configuration memories) that are coupled to the same BL 155-$i$.

In some embodiments, configuration memory latch 300 may form part of a programmable logic device, or a field programmable gate array (FPGA). A latch may be used to store data. In PLDs such as FPGAs, readability of stored latch data is desirable while also maintaining data integrity in the latches. The term non-terminated input refers to a latch input that is not coupled to a high impedance node (e.g., unbuffered latch input). In some embodiments, configuration memory latch 300 may be part of a configuration memory associated with a CLB 156 in FPGA 150. The configuration memory may include several configuration memory latch circuits 300. Configuration memory latch 300 shown in FIG. 3A may be used a with non-terminated (e.g., unbuffered) BL 155, which can improve area efficiency. Because an FPGA may include several million configuration memories, latch based configuration memory (such as configuration memory latch 300) can be more area efficient. Latch based configuration memory is also less susceptible to leakage when compared to register based configuration memory due to lower transistor counts. Further, SRAM type configuration memory is also more complex, whereas latch based configuration memories are typically available in standard cell libraries, thereby lowering development risk.

Non terminated input BL 155, may hold input data for write operations, with writes enabled by asserting WLW 310. BL 155 may also be used to sense data read from configuration latch 300, with reads enabled by asserting WLR 315. In FIG. 3A, in configuration latch 300, signals WLR 315 and WLW 310 are not both in an asserted state at any point in time. BL 155 is driving when WLW 310 is asserted and BL 155 is receiving when WLR 315 is asserted. Input WLW 310 is inverted by inverter 330-1 and the inverted output $\overline{WLW}$ is input to the p-gate input of TG1 332-1 and the n-gate input of TG2 332-2. Conversely, input WLW 310 is also input to the n-gate input of TG1 332-1 and the p-gate input of TG2 332-2.

In the circuit of FIG. 3A, during write operations latched data reflects the state of BL 155. Accordingly (with WLW 310 asserted), when BL 155 is high, then a "1" is latched, and when BL 155 is "0", then a "0" is latched. However, during read operations, the state of BL 155 is the inverse of the latched data. Accordingly (with WLR 315 asserted), when the previously (stored) latched data is "0", BL 155 is high; and when the previously (stored) latched data is "1", BL 155 is low. Sensing block 362 may be configured to correctly read the latched data for a configuration memory bit based on the state of BL 155.

In some embodiments, configuration latch 300 may include a D-Latch 302, coupled to: (a) pull-down network 304, which, when activated, facilitates sensing "0" (on BL 155) by sensing block 362 during read operations, and (b) weak pull-up, which (when pull-down down network 304 is inactive) facilitates sensing "1" (on BL 155) by sensing block 362 during read operations. Data is written to latch 302 using input non-terminated BL 155 with WLW 310 asserted. Sensing block 362 senses data on BL 155 when WLR 315 and read enable 320 are both asserted. For example, sensing block 362 may comprise circuitry to sense the state ("1" or "0") of BL 155 during read operations when Read Enable signal 320 is asserted. As outlined previously, the state of BL 155 during read operations is indicative of the stored latched data being read.

Reading of latched data is facilitated by sensing block 362 based on the state (high or low) of BL 155 when WLR 315 and Read Enable 320 are both asserted. In some embodiments, sensing block 362 may be configured to output a 0 for a configuration memory bit when BL 155 is high, and output a 1 for the configuration memory bit when BL 155 is low. Writing of latch data is performed by asserting WLW 310 and holding BL 155 high, whereas writing 0 is performed by asserting WLW 310 and holding BL 155 low. During reads and in hold states, configuration memory latch 300 maintains stored data values thereby ensuring data integrity.

In FIG. 3A, reset line 305 is active low so that in normal operation reset line is held high (1). To reset configuration latch 300, reset line 305 is pulled low (0), which results in output of NAND gate 334 being 1. The output of NAND gate 334 is inverted by inverter 330-3 so that output 360 is 0, thus resetting configuration latch 300.

As shown in FIG. 3A, in configuration latch 300, the BL 155 input to transmission gate TG1 332-1 is not terminated, which eliminates input buffering and lowers latch transistor count. In FIG. 3A, BL 155 is an in-out (bi-directional) signal, where BL 155 is driving when WLW 310 is active ("1"), and BL 155 is receiving when WLR 315 is active ("1"). In FIG. 3A, WLW 310 and WLR 315 cannot both be active simultaneously.

In some embodiments, the output of D-latch 302 at Node Q may be inverted by one or more inverters such as inverter 330-3 (shown in FIG. 3A), and used to drive output 360. In embodiments (such as FIG. 3A) that use single inverter 330-3, adequate driving capability may be ensured (e.g., to avoid crosstalk). In some embodiments, additional drivers may be used depending on the operating environment and other parameters such as size constraints.

When WLW 310 is active, TG1 332-1 is "On" and TG2 332-2 is in a high impedance state so that BL input 155 is latched when WLW 310 is de-asserted (TG1 332-1 is "off" and TG2 332-2 is "on"). During write operations (with WLW 310 active), timing issues can be managed with data stability on BL 155 being maintained over a time period beginning prior to assertion of WLW 310 and ending after the de-assertion of WLW 310 to ensure that data on BL 155 is latched and the write operation succeeds.

When reading, bus-keeping effected by weak pull-up R1 341, and/or precharge operations by programming logic circuitry may be used to condition BL 155. Because a read operation is being performed, WLR signal 315 is active, while WLW signal 310 is inactive for the duration of the read operation. Prior to the assertion of WLR signal 315, BL signal 155 stays high because of the effect of weak pull up R1 341. Weak pull up R1 341 is placed on BL 155 furthest away from the detection circuits and serves to pull up BL 155 prior to the assertion of WLR signal 315. Weak pull up R1 341 is typically placed further away from the detection circuit (sensing block 362) to minimize the voltage drop across the metal wire (associated with BL 155) between the detection circuit and the D-latch 302. The voltage drop is caused by the current path from weak pull up R1 341 to nMOS transistor T2 340-2 of the read (pull-down) network.

When reading a "1", WLR 315 is active, WLW 310 is inactive, and the gate g2 of nMOS transistor T2 340-2 (FIG. 3A) will be at "1" (g2=1). Therefore, in pull down network comprising of the nMOS transistor stack T1 340-1 and T2 340-2, T1 340-1 is on (WLR=1), and T2 340-2 is on (g2=1). Accordingly, BL 155 is pulled to 0, and sensing block 362 may detect or be configured to output a "1" (representing the latched data. When WLR 315 is de-asserted following read, gate g1 of nMOS transistor T1 340-1 is 0, and T1 304-1 is turned off. Accordingly, weak pull up R1 341 operates to pull up BL 155 subsequent to the de-assertion of WLR 315. The output signal 360 stays at 1 ($V_{DD}$) throughout.

When the stored latch data that is to be read is "0", upon assertion of WLR 315, transistor T1 340-1 is on (gate g1 of transistor T1 340-1 is "1"), and, gate g2 of nMOS transistor T2 340-2 is "0." Accordingly, transistor T2 340-2 is off and BL 155 is pulled to 1 by weak pull up R1 341. As outlined previously, when BL 155 is pulled to 1, sensing block 362 (FIG. 3A) may detect or be configured to output a "0" (representing the latched data) corresponding to the stored configuration memory bit. Data is read during the assertion of WLR 315 (and Read Enable 320).

In FIG. 3A, because the input to TG-1 332-1 is non-terminated, D-latch 302 is not a high-impedance node. Further, non-termination can affect timing depending on how many non-terminated inputs are connected to D-latch 302 when the TG-1 332-1 is active. For example, propagation delay may deteriorate rapidly with increased fan in.

Figure 3B:
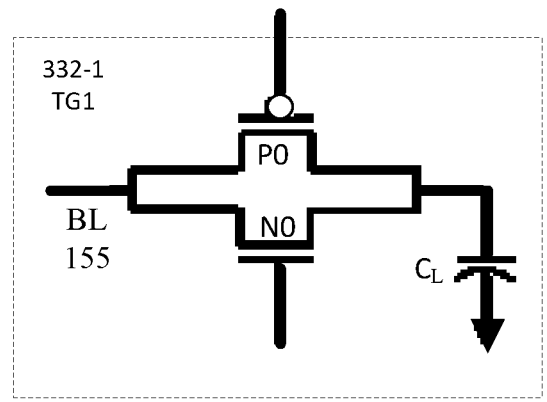
FIG. 3B shows a simplified model of transmission gate with non-terminated input bit line (BL) and parasitic capacitance of the transmission gate modeled as a capacitive load.

FIG. 3B shows a simplified model of transmission gate TG1 332-1 with non-terminated input BL 155 and parasitic capacitance of TG1 332-1 modeled as capacitive load CL. In FIG. 3B, when TG1 332-1 is turned "ON", the transistors act as a low resistive path to capacitive load CL. As the number of transmission gates connected to a node increases, the timing (e.g. propagation delay) of a path that includes the node may become unpredictable when multiple transmission gates are on. Moreover, many CAD tools assume input termination, so CAD tools may be less accurate during design in terms of determining actual timing.

Figure 3C:
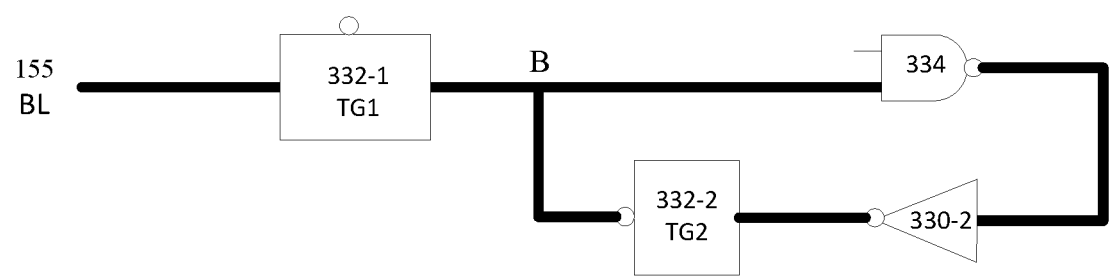
FIG. 3C shows a portion of an example non-terminated D-latch circuit to illustrate some potential issues that may arise with a non-terminated input.

FIG. 3C shows a portion of D-latch circuit 302 to illustrate some other potential issues that may arise with a non-terminated input. In FIG. 3C, when Node B is high (e.g. at $V_{DD}$) and the input is low (e.g. at 0V), there is leakage from Node B to input BL 155 because TG1 332-1 is not a high impedance node. Conversely, when Node B is low (e.g. at 0V) and the input is high (e.g. at $V_{DD}$), there is leakage from input BL 155 to Node B. When the number of D-latches 302 connected to node is below some threshold, the leakage, while not desirable, may be tolerable. However, as the number of D-latches 302 connected to the node increases (e.g. beyond the threshold), the cumulative leakage may present impediments to design and limit flexibility. Thus, input termination may be preferred in some instances.

Figure 3D:
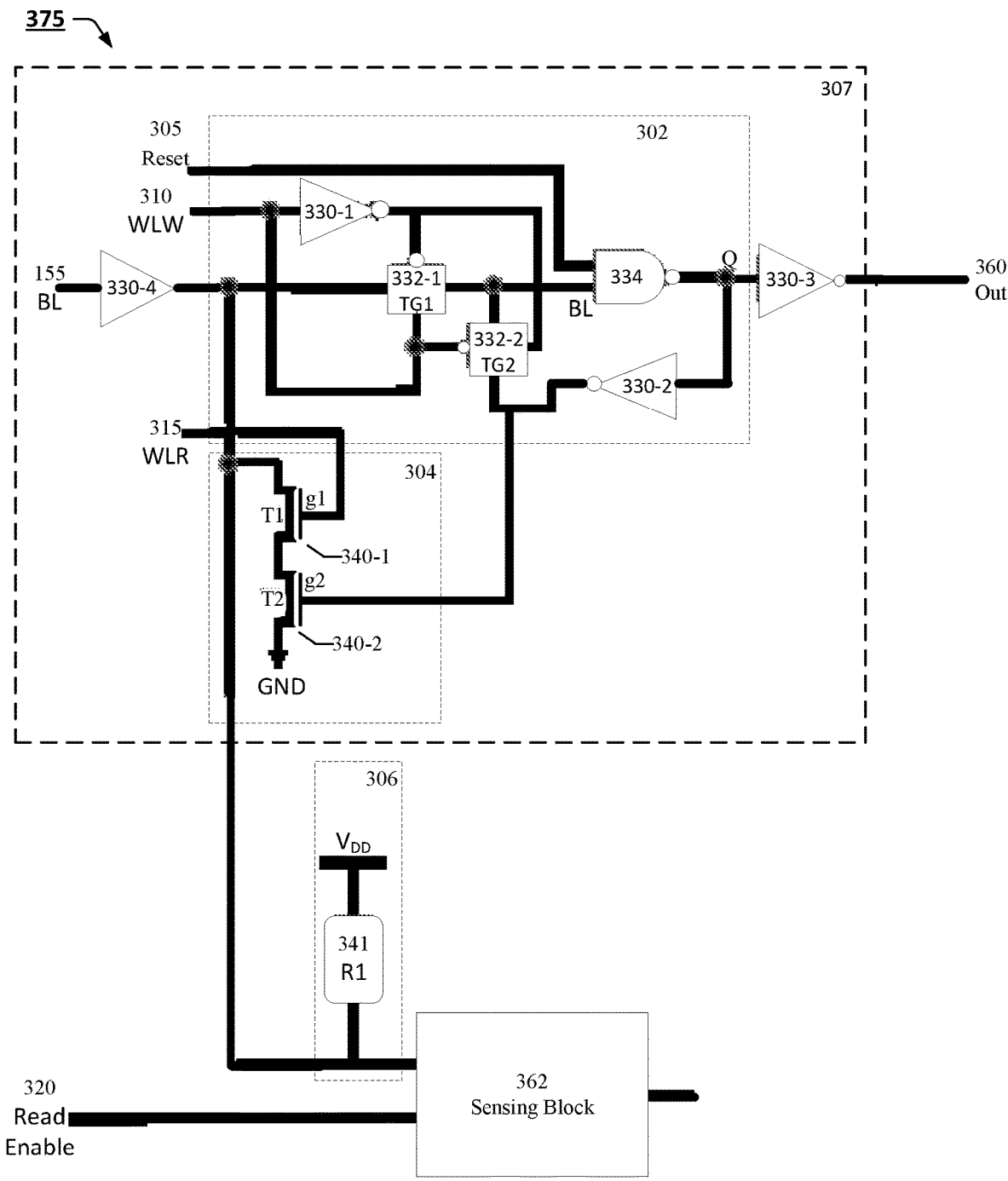
FIG. 3D shows an example configuration memory latch with input termination to BL provided in the form of an input buffer.

FIG. 3D shows an example configuration memory latch 375 with input termination to BL provided in the form of input buffer 330-4. The operation of configuration memory latch 375 is similar to configuration memory latch 300 (FIG. 3A) but configuration memory latch 375 uses input termination in the form of input buffer 330-4 coupled to BL 155 to address the issues outlined above (e.g. in relation to FIGS. 3B and 3C).

However, while example configuration memory latch 375 with input termination may address and/or mitigate the issues outlined above—the addition of input buffer 330-4 increases transistor count relative to the non-terminated configuration memory latch 300 of FIG. 3A. Thus, the area-efficiency of configuration memory latch 375 with input termination may be lower and configuration memory latch 375 with input termination may occupy a greater fraction of die area. Because configuration memory latches can be high usage elements (often running into millions of units) in PLDs, the impact to overall area usage can offset some of the advantages of termination.

Figure 4A:
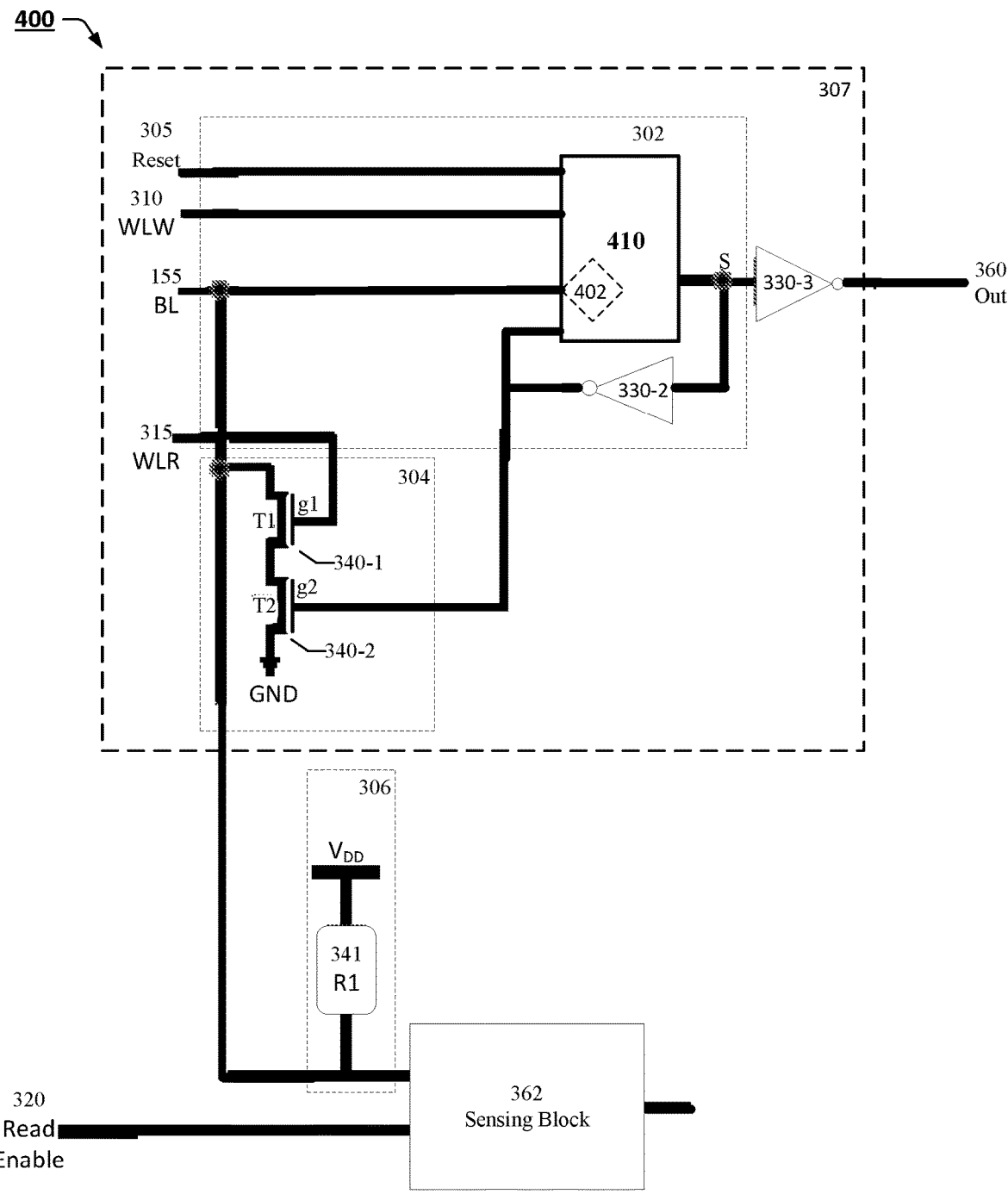
FIG. 4A shows a schematic illustrating an example readable and resettable configuration memory latch that provides input termination.

FIG. 4A shows a schematic illustrating a readable and resettable configuration memory latch 400 that provides input termination. In some embodiments, block 410 in FIG. 4A may be replaced with the circuit in block 410 in FIG. 4B. Dashed block 402 in FIG. 4A merely illustrates that block 410 provides input termination to BL 155. Block 410 in FIG. 4A merely illustrates how the circuit shown in block 410 in FIG. 4B could operate in a configuration memory latch.

Figure 4B:
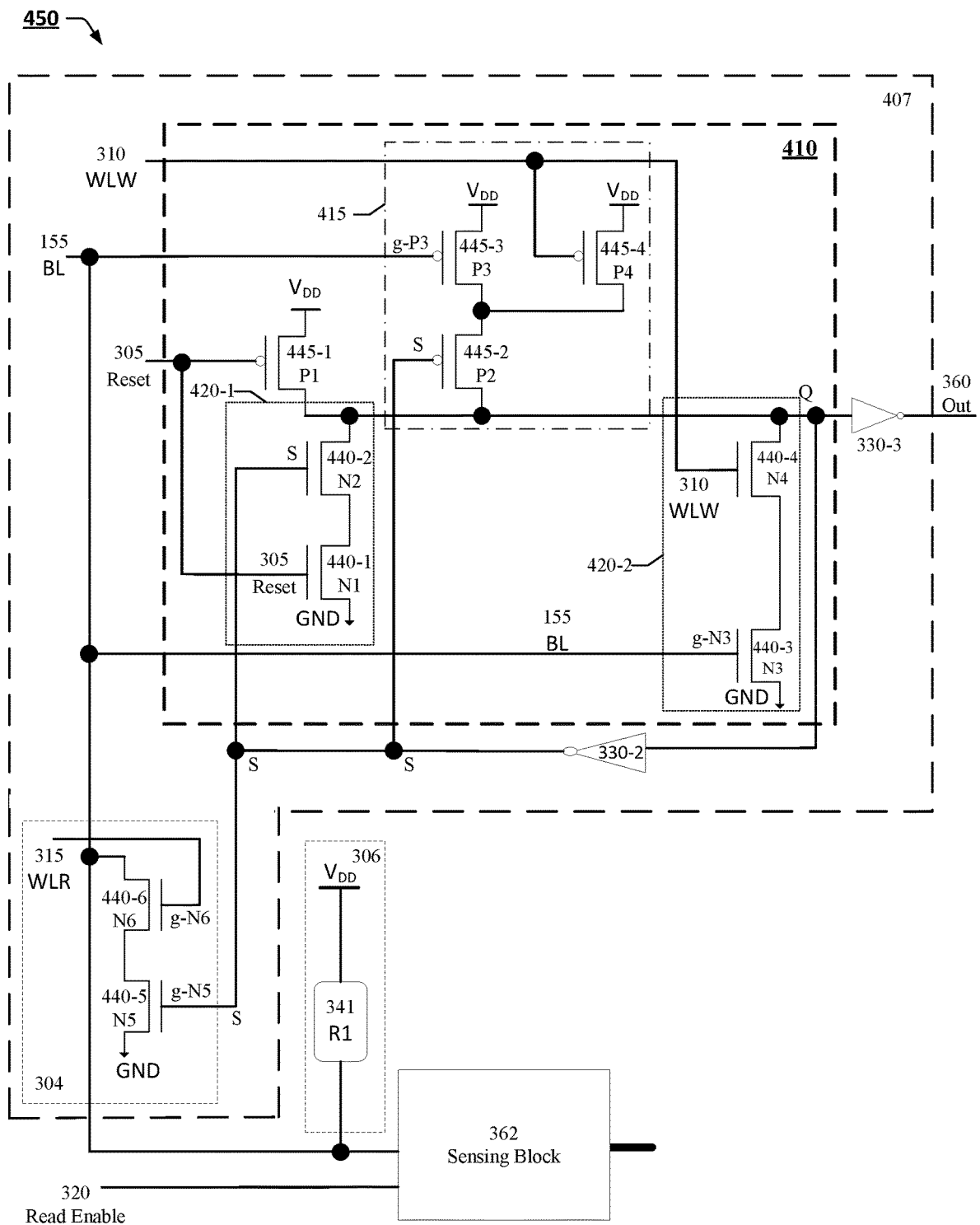
FIG. 4B shows another schematic illustrating an area-efficient readable and resettable configuration memory latch 450.

FIG. 4B shows another schematic illustrating an area-efficient readable and resettable configuration memory latch 450. Circuit 450 may provide functionality associated with an input terminated, area efficient, readable and resettable configuration memory latch. In some embodiments, configuration memory latch circuit 450 may form part of a programmable logic device (PLD), or a field programmable gate array (FPGA). The operation of configuration memory latch 450 is described below.

In FIG. 4B, as outlined with respect to FIG. 3A, the outer dashed block 407 shows circuit elements that are repeated for each readable and resettable configuration memory latch (e.g., in one or more configuration memories), whereas circuit elements outside block 407 may be common to a plurality of configuration memory latches (in one or more configuration memories). For example, the circuitry in block 407 may be repeated for each configuration latch in a configuration memory and there may a plurality of configuration memories coupled to BL 155. Further, as shown in FIG. 4B, a single pull-up 306 and a single sensing block 362 may be coupled to a BL 155. Thus, a single pull up 306 and a single sensing block 362 may be coupled to plurality of blocks 407. Therefore, it is understood, when referring to configuration memory latch 450, that a single pull up 306 and a single sensing block 362 coupled to a BL 155-i may serve as a pull-up and a sensing block, respectively, for a plurality of blocks 407 (in one or more configuration memories) that are coupled to the same BL 155-i.

As shown in FIG. 4B, BL 155 is coupled to the gate inputs g-P3 and g-N3 of pMOS transistor P3 445-3 and nMOS transistor N3 440-3, respectively. Accordingly, transistors P3 445-3 and N3 440-3 provide input termination because very high impedance exists between the gate inputs and the respective drain and source. In configuration memory latch 300 (FIG. 3A), however, BL 155 is coupled to drain or source of transistors in TG1 332-1 (as shown in FIG. 3B), where impedance is lower.

In addition, because of the greater relative isolation provided between the (BL 155 input to) gates g-P3 and g-N3 of pMOS transistor P3 445-3 and nMOS transistor N3 440-3 and the corresponding drains/sources of the respective transistors, circuit 410 has a lower leakage profile. In configuration memory latch 300 (FIG. 3A), however, BL 155 is coupled to drain or source of transistors in TG1 332-1 (as shown in FIG. 3B), so drain-source leakage may occur.

Further, static power consumption of circuit 410 is lowered due at least in part to the lower leakage profile of example circuit 410. From a dynamic perspective, during operation when BL 155 undergoes state changes (being charged and discharged), coupling capacitance CL (FIG. 3B) that is present in TG1 332-1 (in the configuration memory latch 310 of FIG. 3A) is absent in circuit 410 (in configuration memory latch of FIG. 4A), which leads to lower dynamic power consumption. Thus, configuration memory latch 450, in addition to providing input termination, exhibits desirable characteristics include lower leakage and lower static and dynamic power consumption.

In FIG. 4B, WLW 310, BL 155, Reset 305 and node S are each coupled to the gate input of a corresponding pMOS transistor (445) and to the gate input of a corresponding nMOS transistor (440). Accordingly, if one of the coupled transistors is turned ON based on the logic level of the associated input signal, then the other coupled transistor is turned OFF. Further, as outlined above, assertions of WLW 310 and WLR 315 do not overlap in time.

Q is pulled up (and Out 360 is low) if either: (a) P1 445-1 is ON (Reset asserted), or (b) (i) P2 445-2 is ON (S=0) and P3 445-3 is ON (BL=0) or, (ii) P2 445-2 is ON (S=0) and P4 454-4 (WLW=0) is ON.

Conversely, Q is pulled low (Out 360 is high) if either: (c) N1 440-1 is ON (Reset=1) and N2 440-2 is ON (S=1), or (d) N3 440-3 is ON (BL=1) and N4 440-4 is ON (WLW=1).

In FIG. 4B, reset 305 is active low and latch reset is initiated by asserting (pulling low) reset 305. During reset (when reset 305 is asserted), there is a path from node Q to supply voltage $V_{DD}$ but no path from node Q to ground so that node Q is pulled high and the out 360 is 0 as explained further below During reset, WLW 310 and WLR 315 are both low, accordingly, when reset signal 305 is asserted: (1) P1 445-1 is on and N1 440-1 is off (and there is no path to ground via the N1 440-1), so that node Q is pulled high ("1"), which is inverted by inverter 330-3 so that output signal 360 is zero; (2) the signal at node Q is also inverted by inverter 330-2 so that node S is zero (S=0) and N2 440-2 is also off (no path to ground via the N1 440-1 and N2 440-2 pair); (3) further, when BL 155 is 0, P3 445-3 is on and P2 445-2 is also on (node S=0), so node Q is pulled up and stays high; also, N4 440-4 is off (WLW=0) and N3 440-3 is off (BL=0) so that (there is no path to ground via N3 440-3 and N4 440-4 pair and) node Q stays high; and (4) finally, when BL 155 is 1, P4 445-4 is on (WLW=0) and P2 445-2 is on (node S=0), so node Q stays high; further N4 440-4 is off (WLW=0) so that node Q stays high. In some embodiments, because BL 155 may be coupled to a bus keeper and the level of BL 155 during reset does not impact the reset cycle as there is no path to ground that could cause signal contention. At the end of the reset cycle, with P2 445-2 on and N2 440-2 off, "1" is latched and output 360 is 0.

Following reset (reset signal 305=1) when reset is de-asserted with WLW 310 held low (WLW=0), N1 440-1 is turned on but N2 440-2 remains off because S=0. Thus, no path to ground exists and node Q stays at 1 as outlined below. Once the reset cycle is complete and reset 305 is de-asserted (reset=1), WLW 310 is 0, node Q is at 1, and node S is at 0, while bit line may be either 0 or 1. When reset is 1, P1 445-1 is off and N1 440-1 is on, but N2 440-2 is off (S=0) so there is no path from P1 445-1 to ground via the N1 440-1 and N2 440-2 pair. Further, since WLW 310 is 0, P4 445-4 is on, and P2 445-2 is on (S=0), so node Q stays high and output signal 360 stays at 0. The analysis above pertaining to the state of BL 155 also applies when reset 305 is de-asserted as is not repeated here.

When writing a "0", WLW 310 is 1, BL 155 is 0 and reset 305 is 1 (de-asserted). Accordingly, P4 445-4 is turned off (WLW=1), while P3 445-3 is turned on (BL=0), and P2 445-2 is turned on (with S=0, as outlined above, following de-assertion of reset), so node Q stays high. Further, N3 440-3 is off (BL=0) so there is no path from Q to ground (via the N3 440-3 and N4 440-4 pair) and Q stays high and S stays at 0. N2 440-2 is off (S=0), so there is no path to ground via N1 440-1. Node Q is inverted by inverter 330-3 so output signal 360 is 0.

When writing a "1", WLW 310 is 1, BL 155 is 1, and reset 305 is 1 (de-asserted). Accordingly, P3 445-3 and P4 445-4 are both off, so there is no path to $V_{DD}$ (either via P1 445-1 (because reset=1), or via the pull-up network of P2 445-2, P3 445-3, and P4 445-4). However, N3 440-3 is on (BL=1) and N4 440-4 is on (WLW=1), so node Q is pulled low by the pull-down network comprising N3 440-3 and N4 440-4. Accordingly, S=1 and out 360=1. Further, N1 440-1 is on (reset=1) and N2 440-2 is on (S=1) so that pull-down network comprising N1 440-1 and N2 440-2 also operates to pull node Q low.

However, following the writing of a 1, with node S now at 1, P2 445-2 is off so there is no path to $V_{DD}$ even when the value of BL is changed to 0 and the pull-up network of P2 445-2, P3 445-3, and P4 445-4 cannot now pull-up node Q.

In some embodiments, the assertion of reset 305 prior to each write cycle may facilitate writes of "0" or "1" to the configuration memory latch 450. Following the assertion of reset 305, either "0" or "1" may be written to configuration memory latch 407 in the next write cycle.

As shown in FIG. 4B, WLR 315 is input to gate g-N6 of nMOS transistor N6 440-6. When reading a "1", WLR 315 is active, WLW 310 is inactive, and the gate g-N5 of nMOS transistor N5 440-5 will be at "1" (S=1). Therefore, in pull down network comprising of the nMOS transistor stack N5 440-5 and N6 440-6, N6 440-6 is on (WLR=1), and N5 440-5 is on (S=1). Accordingly, BL 155 is pulled to 0, and sensing block 362 may detect or be configured to output a "1" (representing the latched data).

When the stored latch data that is to be read is "0", upon assertion of WLR 315, transistor N6 440-6 is on and nMOS transistor N5 440-5 is off (S=0). As outlined previously, when BL 155 is pulled to 1, sensing block 362 (FIG. 3A) may detect or be configured to output a "0" (representing the latched data) corresponding to the stored configuration memory bit. Data is read during the assertion of WLR 315 and Read Enable 320.

Thus, in some embodiments, configuration memory latch 407 (shown in FIG. 4B) is area efficient, resettable (e.g. via reset input 305), input-terminated (because BL 155 is coupled to gate inputs of P3 445-3 and N3 440-3) writeable (e.g. by asserting reset 305 prior to each write cycle) and readable (e.g. by asserting WLR 315). The area efficiency of configuration memory latch 407, in some embodiments, is manifested in the 14 transistors used to implement the latch (inclusive of transistors in inverters 330-2 and 330-3) relative to the 18 transistors used in the input terminated latch of FIG. 3D. In addition, as outlined above, the circuit of FIG. 4B, exhibits desirable characteristics including lower leakage, and lower static and dynamic power consumption.

Figure 4C:
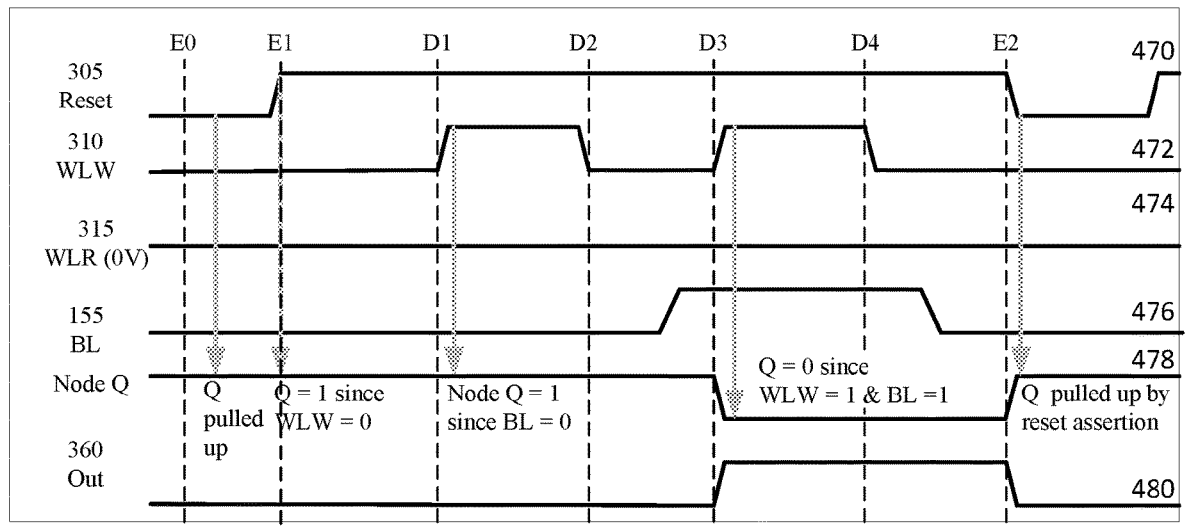
FIG. 4C shows a timing diagram illustrating signal transitions during reset and write cycles in the configuration memory latch of FIG. 4B.

FIG. 4C shows a timing diagram illustrating signal transitions during reset and write cycles in the circuit of FIG. 4B. In FIG. 4C, as shown in waveform 474, WLR 315 is not asserted throughout as no read cycle occurs.

During E0, as illustrated in waveform 470, reset 305 is asserted, and Node Q is pulled up by pMOS transistor 445-1 as shown in waveform 478. WLW 310 and BL 155 are at logic 0, during E0, as shown in waveforms 472 and 476, respectively. Output 360 is at 0 as shown in waveform 480.

At the start of E1, reset 305 is de-asserted as shown in waveform 470. In E1, as shown in waveform 478, node Q is pulled up and stays at 1 because P4 445-4 is on (WLW=0)

and P2 445-2 is on (S=0) providing a path to $V_{DD}$. Output 360 is at 0 as shown in waveform 480.

At the start of D1, to write a 0, WLW 310 is asserted and BL 155 is at 0 as shown in waveforms 472 and 476, respectively. Node Q is pulled up and stays at 1, P4 445-4 is on (WLW=0), P3 445-3 is on (BL=0), and P2 445-2 is on (S=0), thus providing a path to $V_{DD}$.

During D2, as shown in waveform 476, BL 155 transitions to 1. However, node Q stays at 1 because P4 445-4 is on (WLW=0) and P2 445-2 is on (S=0). Subsequently, at the start of D3, WLW 310 is asserted, as shown in waveform 472. With WLW=1 and BL=1, N4 440-4 and N3 440-3 are on so that node Q is pulled to 0 starting at D3, as shown in waveform 478. Accordingly, output 360 transitions to 1 starting at D3 as shown in waveform 480. At D4, WLW 310 transitions to 0 and subsequently, in D4 BL 155 transitions 0.

With WLW asserted, while any subsequent transitions of BL to 0 may turn on P3 445-3, node Q will remain at 0 so that S=1 and P2 445-2 stays off. Thus, there is no path to $V_{DD}$ and output 360 stays at 1 regardless of the 0 value of BL 155.

Accordingly, for a subsequent write cycle, as outlined above, and as shown in waveform 470, reset 305 is asserted again at E2, with WLW 310 (waveform 472) and WLR 315 (waveform 474) both de-asserted. Node Q (waveform 478) is then pulled up at E2 upon assertion of reset and output 360 (waveform 480) transitions to low. Upon completion of the reset cycle, as outlined above, the next write cycle may commence.

Figure 4D:
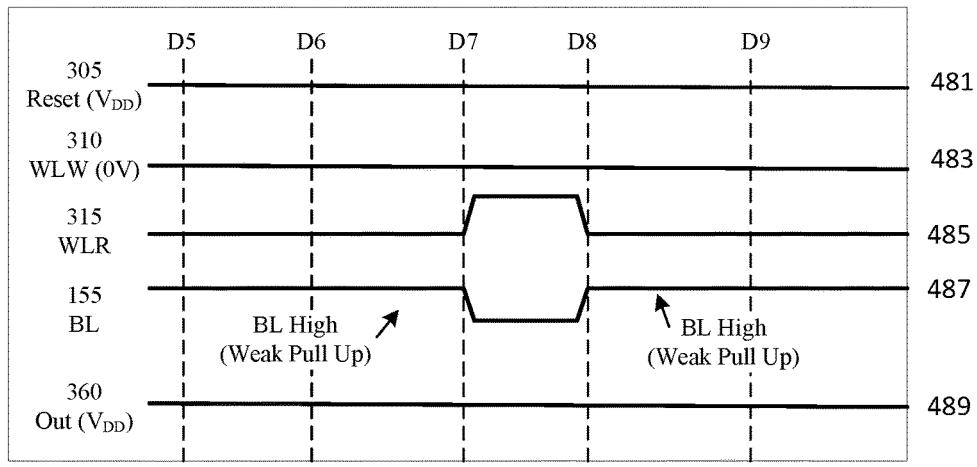
FIG. 4D shows timing diagram illustrating signal transitions during a read operation of a configuration bit in configuration memory latch of FIG. 4B, where the latch data to be read is "1".

FIG. 4D shows timing diagram illustrating signal transitions during a read operation (e.g., sensed by sensing block 362 with read enable 320 asserted) of a configuration bit in configuration memory latch 450, where the latch data to be read is "1". When reading, bus-keeping effected by weak pull-up R1 341, and/or precharge operations by programming logic circuitry may be used to condition BL 155 prior to reading (e.g., latch data of "1").

In FIG. 4D, reset line 305 is inactive (at $V_{DD}$) for the duration of the operation (as shown by waveform 481). For example, configuration memory latch 450 may have been previously reset followed by data being written to latch 450 (e.g., as illustrated in FIG. 4C). Further, because the operation is a read operation, WLW signal 310 is inactive for the duration of the operation (e.g., from D5 through D9) as shown in waveform 483. As outlined previously, WLW 310 is not asserted when WLR 315 is in an asserted state and vice versa.

As shown in FIG. 4D, from time D5 to D7 (and prior to the assertion of WLR signal 315), BL signal 155 stays high (as shown by waveform 387) because of the effect of weak pull up R1 341 (FIG. 3A).

Further, as shown in FIG. 4D, at time D7, WLR signal 315 is asserted and remains asserted until time D8 (e.g., as shown in waveform 485). Accordingly, at time D7, when reading a "1", N6 440-6 is on because WLR 315 is active and N5 440-5 is on because S=1 (Node Q=0). Therefore, pull down network 304 is activated and BL 155 is pulled to 0 starting at time D7 (as shown in waveform 487 in FIG. 4D) until time D8. As outlined previously, when BL 155 is pulled low, sensing block 362 (FIG. 4B) may detect or be configured to output a "1" (representing the latched data) corresponding to the stored configuration memory bit. Data is read during the assertion of WLR 315 (and Read Enable 320) from time D7 to D8.

At time D8, WLR 315 is de-asserted so that N6 440-6 is turned off. Accordingly, weak pull up R1 341 (FIG. 4B)

operates to pull up BL 155 at time D8 (as shown in waveform 487 in FIG. 4D) subsequent to the de-assertion of WLR 315. In FIG. 4D, the output signal 360 stays at 1 ($V_{DD}$) throughout as indicated by waveform 489.

Figure 4E:
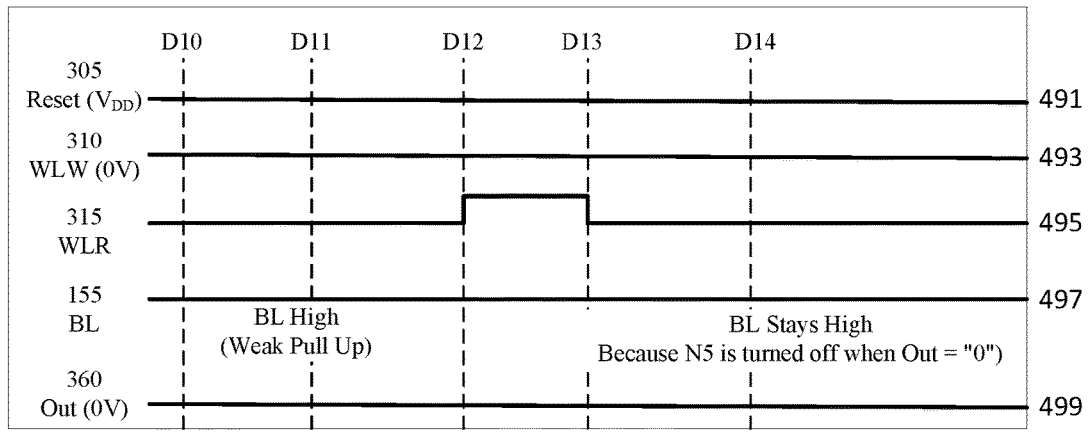
FIG. 4E shows a timing diagram illustrating signal transitions during a read operation of a configuration bit in the configuration memory latch of FIG. 4B, where the stored latch data that is to be read is "0".

FIG. 4E shows a timing diagram illustrating signal transitions during a read operation (e.g., sensed by sensing block 362 with read enable 320 asserted) of a configuration bit in configuration memory latch 450, where the stored latch data that is to be read is "0". In FIG. 4E, reset line 305 is inactive (at $V_{DD}$) from D10 through D14 (as shown by waveform 491). For example, configuration memory latch 450 may have been previously reset followed by data (e.g., "0") being written to latch 450 (e.g., as illustrated in FIG. 4C). Further, because the operation is a read operation, WLW signal 310 is also inactive for the duration (e.g., from D10 through D14) shown in waveform 493 (in FIG. 4E). Accordingly, previously latched data (e.g., during the write operation) "0" may be output. In FIG. 4E, output signal 360 stays low at 0V, as shown by waveform 499.

Further, in FIG. 4E, prior to time D12, during which time WLR 315 remains de-asserted (as shown in waveform 495), BL 155 stays high (as shown in waveform 497) because of the action of weak pull up R1 341. At time D12, WLR 315 is asserted (as shown in waveform 495). Therefore, with reference to FIG. 4B, upon assertion of WLR 315, N6 440-6 is on and N5 440-5 is off because S=0 (Node Q is at 1). Accordingly, pull-down network 304 is deactivated and BL 155 is pulled to 1 by weak pull up R1 341. As outlined previously, when BL 155 is pulled to 1, sensing block 362 (FIG. 4B) may detect or be configured to output a "0" (representing the latched data) corresponding to the stored configuration memory bit. Data is read during the assertion of WLR 315 (and Read Enable 320) from time D12 to D13.

Referring to FIG. 4B, in some embodiments, a configuration memory latch circuit 450 may comprise: (1) a first pMOS transistor (P1 445-1), wherein a first pMOS source of the first pMOS transistor (P1 445-1) is coupled to $V_{DD}$ and a first pMOS drain of the first pMOS transistor is coupled to a first node Q; (2) a first pull-down network (e.g. 420-1) comprising a first nMOS transistor (N1 440-1) in series with a second nMOS transistor (N2 440-2), wherein the first nMOS transistor (N1 440-1) source is coupled to ground (GND) and the second nMOS transistor (N2 440-2) drain is coupled to the first node Q; (3) a second pull down network (e.g. 420-2, comprising N3 440-3 and N4 440-4) in parallel with the first pull-down network (e.g. 420-1), wherein the second pull-down network (e.g. 420-2) comprises a third nMOS transistor (N3 440-3) in series with a fourth nMOS transistor (N4 440-4), wherein the third nMOS transistor (N3 440-3) source is coupled to ground (GND), and the fourth nMOS transistor drain is coupled to the first node (Q); (4) a first pull up network (e.g. pull-up network 415), wherein the first pull up network comprises a second pMOS transistor (e.g. P2 445-2), a third pMOS transistor (e.g. P3 445-3), and a fourth pMOS transistor (e.g. P4 445-4), wherein the second pMOS transistor (e.g. P2 445-2) drain is coupled to the first node (Q), the third pMOS transistor (P3 445-3) drain and the fourth pMOS transistor (P4 445-4) drain are both coupled to the second pMOS transistor (P2 445-2) source, and the third pMOS transistor (P3 445-3) source and the fourth pMOS transistor (P4 445-4) source are both coupled to the supply voltage (e.g. $V_{DD}$); (5) an input reset line (305) coupled to the first pMOS transistor (P1 445-1) gate and to the first nMOS transistor (N1 440-1) gate, wherein the reset line is active low; (6) a first inverter (330-2), wherein the input of the first inverter (330-2) is coupled to the first node Q, and the output of the first inverter (330-2) is coupled to the second pMOS transistor (P2 445-2) gate and to the second nMOS transistor (N2 440-2) gate; (7) a bit line (BL) signal (e.g. BL 155) to input a first data to be written into the configuration memory latch (e.g. 450) during write operations, wherein the BL is coupled to the third pMOS transistor (P3 445-3) gate and to the third nMOS transistor (N3 440-3) gate, and, wherein a state of the BL, during read operations, is indicative of a data stored in the configuration memory latch (e.g. 450); (8) an input Word Line Write (WLW) (e.g. WLW 310) signal, which, when asserted, enables data to be written to the configuration memory latch, wherein the WLW signal is coupled to the fourth pMOS transistor (P4 445-4) gate and to the fourth nMOS transistor (N4 440-4) gate; and (9) a second inverter (330-3), wherein the input of the second inverter (330-3) is coupled to the first node Q, and the output of the second inverter (330-3) drives an output line (out 360) of the configuration memory latch (450).

In some embodiments, in configuration memory latch circuit 450, a new reset cycle may be initiated prior to each assertion of WLW, wherein each reset cycle may comprise asserting reset followed by de-asserting reset.

In some embodiments, configuration memory latch circuit 450 may further comprise: (10) a word line read (WLR) signal, which, when asserted, enables data to be read from the configuration memory latch. In some embodiments, a state of the BL (e.g. BL 155), during read operations (e.g. when WLR 315 is asserted), may be indicative of a data stored in the configuration memory latch. For example, in some embodiments, configuration memory latch circuit 450 may further comprise: (11) a third pull-down network (e.g. pull-down network 304) comprising a fifth nMOS transistor (e.g. N5 440-5) coupled in series to a sixth nMOS transistor (e.g. N6 440-6), wherein the sixth nMOS transistor (e.g. N6 440-6) gate is coupled to the WLR signal (e.g. WLR 315), the sixth nMOS transistor (e.g. N6 440-6) drain is coupled to the BL (e.g. BL 155), and wherein the fifth nMOS transistor (e.g. N5 440-5) source is grounded and the fifth nMOS transistor (e.g. N5 440-5) gate is coupled to the output of the first inverter (330-2).

In some embodiments, the configuration memory latch circuit 450 may further comprise: (12) a sensing block (e.g. 362), wherein a first input of the sensing block is coupled to a weak pull up (R1 341) on the BL (e.g. BL 155) and a second input of the sensing block is coupled to a read enable signal (e.g. Read Enable 320), wherein the sensing block (e.g. 362) is configured to sense the state of the BL (e.g. BL 155) when the WLR signal (e.g. WLR 315) and the read enable signal (e.g. 320) are both asserted.

Because the gates of nMOS/pMOS transistors are fabricated with non-conducting material, source/drain to gate leakage for a transistor is lower than the source to drain leakage on the corresponding transistor. Configuration memory latch 450 is thus input terminated. Input termination of BL 155 is provided by high impedance between the third pMOS transistor (P3 445-3) gate and the corresponding third pMOS transistor (P3 445-3) source and drain, and high impedance between the third nMOS transistor (N3 440-3) gate and the corresponding third nMOS transistor (N3 440-3) source and drain.

In the configuration memory latch of FIG. 4B, the use of a reset cycle prior to commencement of a new write cycle can impact test coverage, for example, during scan testing using conventional Automatic Test Equipment (ATE) with Automatic Test Program Generator (ATPG) tools. Scan testing is facilitated when state changes occur without constraints in the circuit under test. Typically, in scan testing using conventional tools, reset is global (e.g. resets all latches) and may occur once during a test. Thus, the use of a reset cycle prior to commencement of a new write cycle individually for latches may impact testing of configuration memory latch 450 (FIG. 4B) using conventional ATE.

Scan testing may be viewed as involving three phases: (i) a scan in phase, to input a test vector, (ii) a scan capture phase (e.g. when the device is placed into non-test or operating mode) and the test vector input (in the scan in phase) exercises the functional blocks and output is captured, and (iii) a scan out phase (e.g. when the device may be placed in shift mode again) and output data is shifted out. The term "scan test vector" refers to data shifted into the device under test. Scan test vectors may be generated by ATPG tools.

As outlined above, the scan capture phase is also part of scan testing and facilitates capture of the operating mode. During scan testing, there may be two signals (a) a Scan_mode signal and (b) a Scan_en signal (not shown in FIG. 5A). The Scan_mode signal may switch control of the clock signal and reset/set signals to an external test signal (e.g. from ATE), while the Scan_en signal may determine whether a device is in shift mode.

In test mode, the clock (e.g. Clk) and set/reset signals are controlled externally (e.g. by ATE) during the entirety of scan testing (regardless of whether Scan_en is asserted or de-asserted). The term "test mode," (e.g. when Scan_mode is asserted) as used herein, thus, refers to the scan in, and/or scan capture, and/or scan out phases. The term "shift mode" (e.g. when Scan_en is asserted), which can occur while a device is in test mode, refers to the scan in and scan out phases, while "scan capture" mode refers to the scan capture phase (e.g. when Scan_en is de-asserted but Scan_mode remains asserted). Test output may be compared to expected output by ATE.

Figure 5A:
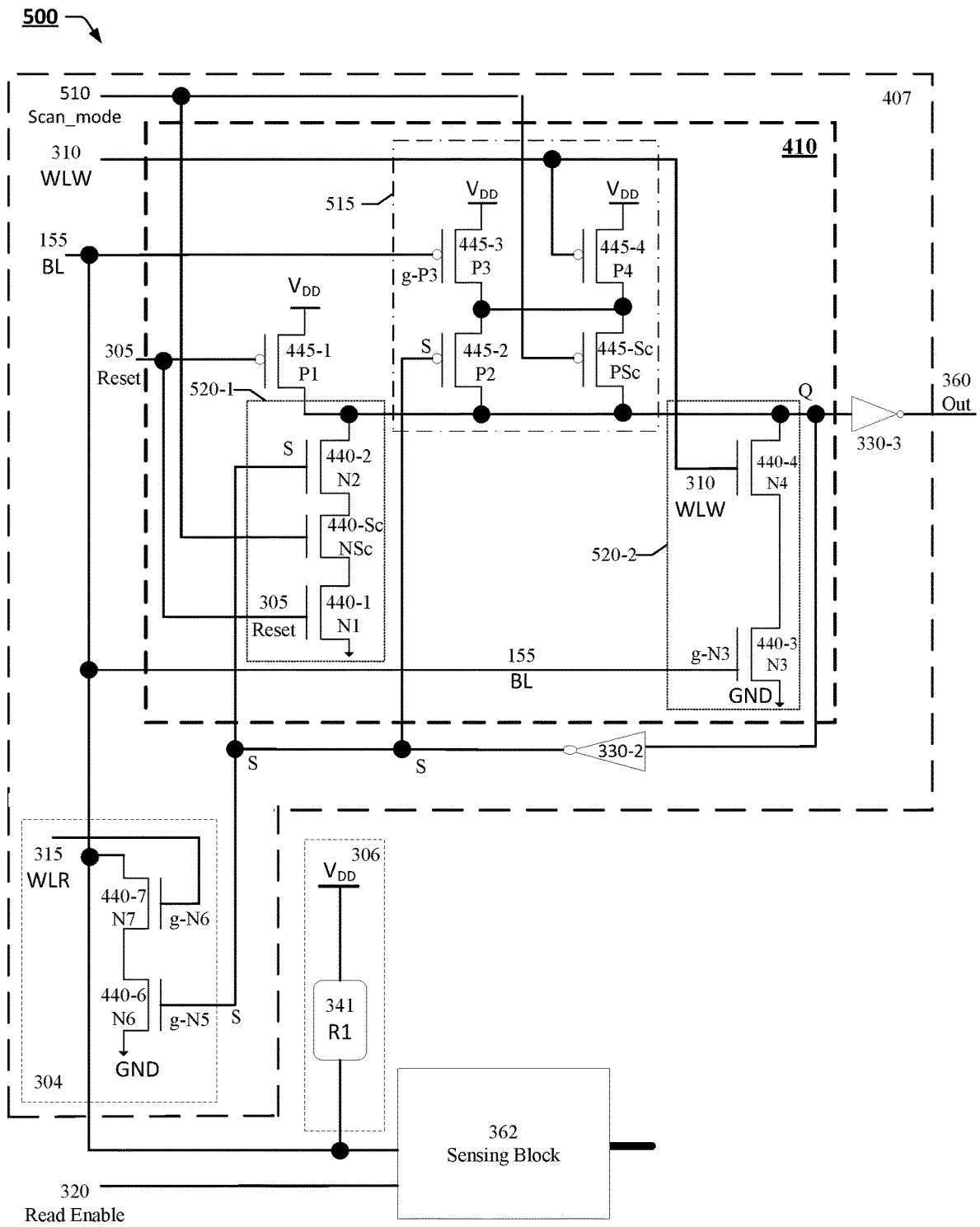
FIG. 5A shows an area-efficient input terminated, resettable, readable, and writeable configuration memory latch circuit with Design for Testability (DFT) features.

FIG. 5A shows an area-efficient input terminated, resettable, readable, and writeable configuration memory latch circuit 500 with Design for Testability (DFT) features. In some embodiments, configuration memory latch circuit 500 may form part of a programmable logic device (PLD), or a field programmable gate array (FPGA). For FIG. 5A, changes relative to the circuit of FIG. 4B are described below.

Configuration memory latch circuit 500 may support scan testing via conventional ATE and/or ATPG tools. The area-efficiency of configuration memory latch circuit 500 is manifested in the lower number of 16 transistors used relative to the 18 transistor configuration for the configuration memory latch of FIG. 3D. As outlined previously, because configuration memory latches can be high usage elements (often running into millions of units) in PLDs, the lower number of transistors in configuration memory latch 500 can reduce the overall area utilized by configuration memory latches in PLDs without loss of existing functionality.

During DFT/Scan mode, Scan_mode 510 (active low) is asserted to enter test mode, reset 305 (active low) is de-asserted, WLR 315 is at "0", and BL 155 controlled by ATPG tools. In some instances, WLW 310 may also be controlled by ATPG tools to (1) facilitate BL 155 data to flow through to output out 360 when WLW 310 is 1, and (2) to keep output out 360 at "0", when WLW=0.

In configuration memory latch circuit 500, pMOS transistor PSc 445-Sc forms part of pullup network 515, where the pMOS transistor PSc 445-Sc source is coupled to pMOS transistor P3 445-3 drain and pMOS transistor P4 445-4 drain. pMOS transistor PSc 445-Sc drain is coupled to node Q. pMOS transistor PSc 445-Sc (when turned on by asserting Scan_mode 510 (Scan_mode=0)) can provide an alternate pull-up path when P2 445-2 is turned off. Accordingly, when Scan_mode 510 is asserted (Scan_mode=0) during testing, with P2 445-2 turned off, if BL is 0, node Q can be pulled up via P3 445-3 and PSc 445-Sc thereby obviating the need for a reset prior to the next write cycle.

Further, in configuration memory latch circuit 500, input signal Scan_mode 510 is provided, which is coupled to pMOS transistor PSc 445-Sc gate and nMOS transistor NSc 440-Sc gate.

In some embodiments, nMOS transistor NSc 440-Sc forms part of pull-down network 520-1 and is series coupled to nMOS transistors N1 440-2 and N2 440-2. nMOS transistor NSc 440-Sc drain is coupled to nMOS transistor N2 440-2 source and nMOS transistor NSc 440-Sc source to nMOS transistor N1 440-1 drain.

When Scan_mode 510 is asserted (Scan_mode=0) during testing, with WLW=1 and BL=1, N3 440-3 and N4 440-4 are both on so that node Q is pulled down via pull-down network 520-2 and out 360 is 1. Further, with WLW=1 and BL=0, P3 445-3 and PSc 445-Sc are both on so that node Q is pulled up via pull-up network 515 and out 360 is 0, Further, because Scan_mode=0, NSc 440-Sc is off so that pull-down network 520-1 is inactive. On the other hand, when Scan_mode 510 is de-asserted (Scan_mode=1), nMOS transistor NSc 440-Sc is on and pull-down via pull-down network 520-1 depends on the states of nMOS transistors N1 440-2 and N2 440-2.

Accordingly, referring to FIG. 5A, in some embodiments, a configuration memory latch circuit 500 may comprise: (1) a first pMOS transistor (P1 445-1), wherein a first pMOS source of the first pMOS transistor (P1 445-1) is coupled to $V_{DD}$ and a first pMOS drain of the first pMOS transistor is coupled to a first node (Q); (2) a first pull-down network (e.g. 520-1) comprising a first nMOS transistor (N1 440-1), a fifth nMOS transistor (NSc 440-Sc), and a second nMOS transistor (N2 440-2) in series, wherein the first nMOS transistor (N1 440-1) source is coupled to ground (GND) and the first nMOS transistor (N1 440-1) drain is coupled to the fifth nMOS transistor (NSc 440-Sc) source, and wherein the fifth nMOS transistor (NSc 440-Sc) drain is coupled to the second nMOS transistor (N2 445-2) source and the second nMOS transistor (N2 440-2) drain is coupled to the first node (Q); (3) a second pull down network (e.g. 520-2, comprising N3 440-3 and N4 440-4) in parallel with the first pull-down network (e.g. 520-1), wherein the second pull-down network (e.g. 520-2) comprises a third nMOS transistor (N3 440-3) in series with a fourth nMOS transistor (N4 440-4), wherein the third nMOS transistor (N3 440-3) source is coupled to ground (GND), and the fourth nMOS transistor drain is coupled to the first node (Q); (4) a first pull up network (e.g. pull-up network 515), wherein the first pull up network comprises a second pMOS transistor (e.g. P2 445-2), a third pMOS transistor (e.g. P3 445-3), a fourth pMOS transistor (e.g. P4 445-4), and a fifth pMOS transistor (e.g. PSc 445-Sc), wherein: (a) the second pMOS transistor (e.g. P2 445-2) drain and the fifth pMOS transistor (Sc 445-Sc) drain are both coupled to the first node (Q), (b) the second pMOS transistor (e.g. P2 445-2) source and the fifth pMOS transistor (Sc 445-Sc) source are each coupled to: (i) the third pMOS transistor (P3 445-3) drain and (ii) the fourth pMOS transistor (P4 445-4) drain, and (c) the third pMOS transistor (P3 445-3) source and the fourth pMOS transistor (P4 445-4) source are both coupled to the supply voltage (e.g. $V_{DD}$); (5) an input reset line (305) coupled to the first pMOS transistor (P1 445-1) gate and to the first nMOS transistor (N1 440-1) gate, wherein the reset line is active low; (6) a first inverter (330-2), wherein the input of the first inverter (330-2) is coupled to the first node Q, and the output of the first inverter is coupled to the second pMOS transistor (P2 445-2) gate and to the second nMOS transistor (N2 440-2) gate; (7) a bit line (BL) signal (e.g. BL 155) to input a first data to be written into the configuration memory latch (e.g. 450) during write operations, wherein the BL is coupled to the third pMOS transistor (P3 445-3) gate and to the third nMOS transistor (N3 440-3) gate, and, wherein a state of the BL, during read operations, is indicative of a data stored in the configuration memory latch (e.g. 450); (8) an input Word Line Write (WLW) (e.g. WLW 310) signal, which, when asserted, enables data to be written to the configuration memory latch, wherein the WLW signal is coupled to the fourth pMOS transistor (P4 445-4) gate and to the fourth nMOS transistor (N4 440-4) gate; (9) a scan mode input, wherein the scan mode input is active low, and wherein the scan mode input is coupled to the fifth pMOS transistor (PSc 445-Sc) gate and to the fifth nMOS transistor (NSc 440-Sc) gate, wherein the scan mode input is asserted to place the configuration memory latch in test mode; and (10) a second inverter (330-3), wherein the input of the second inverter (330-3) is coupled to the first node Q, and the output of the second inverter (330-3) drives an output line (out 360) of the configuration memory latch (450).

In some embodiments, in configuration memory latch circuit 500, in non-test mode with Scan_mode 510 de-asserted (Scan_mode=1), a new reset cycle may be initiated prior to each assertion of WLW, wherein each reset cycle may comprise asserting reset followed by de-asserting reset.

In some embodiments, configuration memory latch circuit 500 may further comprise: (11) a word line read (WLR) signal, which, when asserted, enables data to be read from the configuration memory latch. In some embodiments, a state of the BL (e.g. BL 155), during read operations (e.g. when WLR 315 is asserted), may be indicative of a data stored in the configuration memory latch. For example, in some embodiments, configuration memory latch circuit 500 may further comprise: (12) a third pull-down network (e.g. pull-down network 304) comprising a sixth nMOS transistor (e.g. N6 440-6) coupled in series to a seventh nMOS transistor (e.g. N6 440-7), wherein the seventh nMOS transistor (e.g. N6 440-7) gate is coupled to the WLR signal (e.g. WLR 315), the seventh nMOS transistor (e.g. N6 440-7) drain is coupled to the BL (e.g. BL 155), and wherein the sixth nMOS transistor (e.g. N6 440-6) source is grounded (GND) and the sixth nMOS transistor gate is coupled to the output of the first inverter (330-2).

In some embodiments, the configuration memory latch circuit 500 may further comprise: (13) a sensing block (e.g. 362), wherein a first input of the sensing block is coupled to a weak pull up (R1 341) on the BL (e.g. BL 155) and a second input is of the sensing block is coupled to a read enable signal (e.g. Read Enable 320), wherein the sensing block (e.g. 362) is configured to sense the state of the BL (e.g. BL 155) when the WLR signal (e.g. WLR 315) and the read enable signal (e.g. 320) are both asserted.

In some embodiments, when the scan mode input is asserted, the BL signal (BL 155) may be driven by Automatic Test Pattern Generator (ATPG) tools or Automatic Test Equipment (ATE). Further, in some embodiments, when the scan mode input is asserted: BL data may flow through to output when WLW (WLW 310) is asserted, and output (out 360) is maintained at logic 0, when WLW (WLW 310) is de-asserted.

Figure 5B:
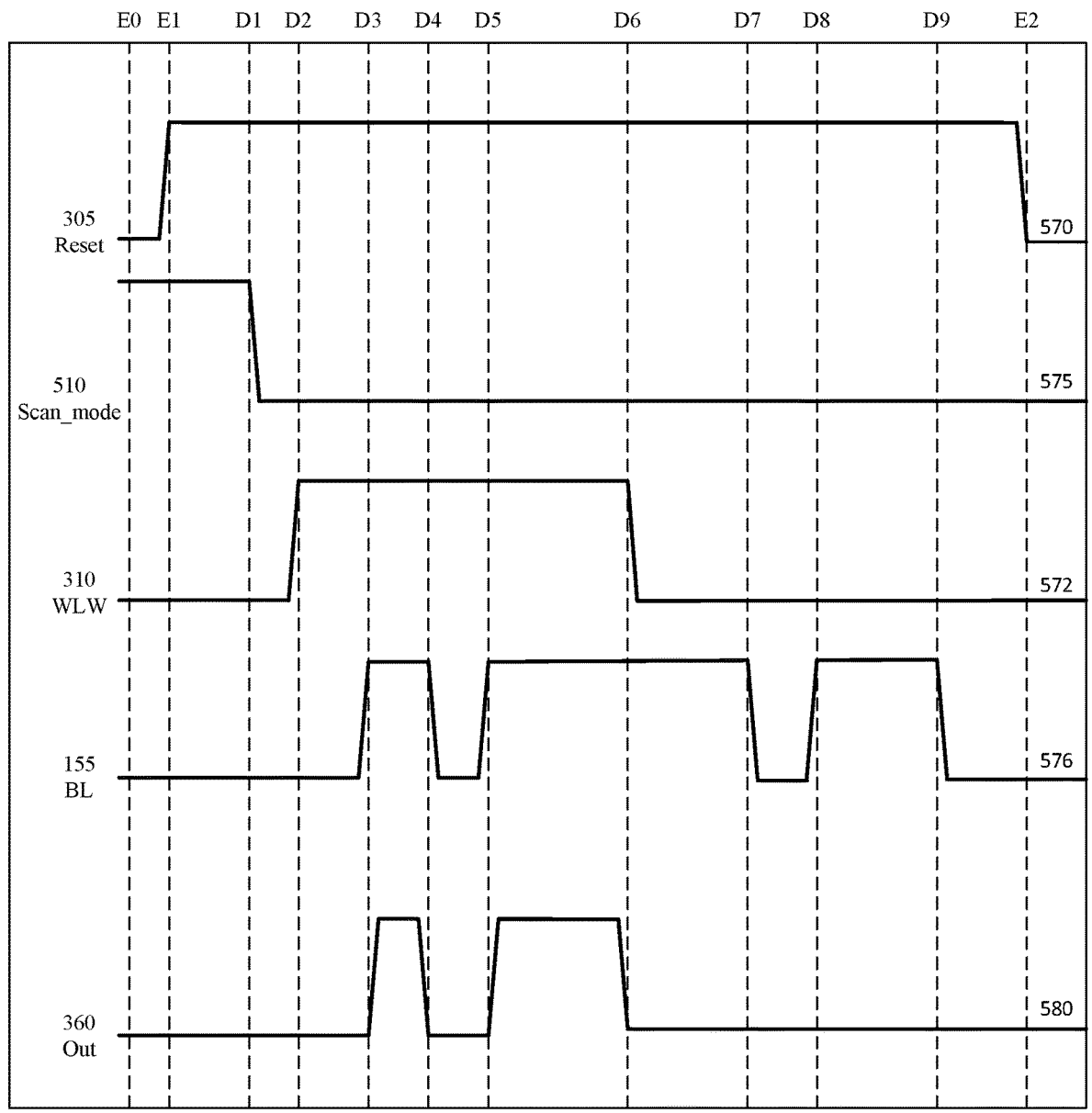
FIG. 5B shows a timing diagram showing signal transitions associated with some signals in the configuration memory latch of FIG. 5A.

FIG. 5B shows a timing diagram showing signal transitions associated with some signals in the configuration memory latch 500.

At E0, as shown in waveform 570, reset 305 is asserted (Reset=0) to reset all latches so that output out 360 is 0. At E1, reset 305 is de-asserted (Reset=1) and the reset cycle for configuration memory latch 500 terminates.

Next, at D1, as shown in waveform 575, Scan_mode 510 is asserted (Scan_mode=0), which causes configuration memory latch 500 to enter test mode. Upon entering test mode, WLW 310 is 0, as shown in waveform 572. With both Scan_mode=0 and WLW 310=0, nMOS transistors NSc 440-Sc and N4 440-4 are both off so that there is no path to ground. Therefore, node Q is at 1, S=0, and output out 360 is 0 as shown in waveform 580.

Indeed, in relation to FIG. 5B and configuration memory latch 500 (FIG. 5A), so long as Scan_mode 510 remains asserted (Scan_mode=0), nMOS transistor 440-Sc is turned off, so that no path to ground exists via pull-down network 520-1.

At D2, WLW 310 transitions to 1 as shown in waveform 572. Accordingly, N4 440-4 is turned on, further BL 155=0, as shown in waveform 576, so that N3 440-3 is off and there is no path to ground. A path to $V_{DD}$ exists via pull-up network 515 (e.g. via P3 445-3 (BL=0) and PSc 445-Sc (Scan_mode=0)). Therefore, node Q remains at 1, S=0, and output out 360 is 0 as shown in waveform 580.

At D3, BL 155 transitions to 1, as shown in waveform 576. Accordingly, N3 440-3 is now turned on, and with WLW 310=1 (waveform 572), N4 440-4 is also on. Therefore, a path to ground exists via pull-down network 520-2, and node Q is 0, so that S=1 and output out 360 is 1 as shown in waveform 580.

At D4, BL 155 transitions to 0, as shown in waveform 576. Accordingly, N3 440-3 is now turned off so no path to ground exists via pull-down network 520-2. As outlined previously, because NSc 440-Sc is off (Scan_mode=0), no path to ground exists via pull-down network 520-1. Node Q is pulled up via P3 445-3 (BL=0) and PSc 445-Sc (Scan_mode=0). Accordingly, node Q is 1, so that S=0 and output out 360 is 0 as shown in waveform 580.

At D5, BL 155 transitions to 1, as shown in waveform 576. Accordingly, N3 440-3 is now turned on, and with WLW 310=1 (waveform 572), N4 440-4 is also on. Therefore, a path to ground exists via pull-down network 520-2, and node Q is 0, so that S=1 and output out 360 is 1 as shown in waveform 580.

At D6, WLW 310 transitions to 0. Accordingly, N4 is turned off and no path to ground exists. Further, a path to $V_{DD}$ exists via P4 445-4 (WLW=0) and PSc 445-Sc Scan_mode=0). Therefore, node Q is pulled up to 1, S=0, and output out 360 is 0 as shown in waveform 580.

From D7 through D9, Scan_mode 510 is 0 and WLW 310 is 0 and no path to ground exists. So, node Q remains pulled up (e.g. via P4 445-4 (WLW=0) and PSc 445-Sc Scan_mode=0)) output out 360 is 0 as shown in waveform 580. At E2, a new reset cycle may be initiated as shown in waveform 570.

Read operations for configuration memory latch 500 are similar to the configuration memory latch 450 and the description and timing diagrams are not repeated.

Thus, in some embodiments, configuration memory latch 500 facilitates resets, reads, and writes in scan mode. Further, during test mode (Scan_mode=0), controllability of configuration memory latch 500 is facilitated because input on BL 155 may be transferred to output (out 360) when WLW 310 is 1, or by maintaining the output (out 360) at 0 by setting WLW 310 to 0.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A configuration memory latch comprising:
   a first pMOS transistor, wherein a first pMOS source of the first pMOS transistor is coupled to a supply voltage and the first pMOS transistor drain is coupled to a first node;
   a first pull-down network comprising a first nMOS transistor in series with a second nMOS transistor, wherein the first nMOS transistor source is coupled to ground (GND) and the second nMOS transistor drain is coupled to the first node;
   a second pull down network in parallel with the first pull-down network, wherein the second pull-down network comprises a third nMOS transistor in series with a fourth nMOS transistor, wherein the third nMOS transistor source is coupled to ground and the fourth nMOS transistor drain is coupled to the first node;
   a first pull up network, wherein the first pull up network comprises a second pMOS transistor, a third pMOS transistor, and a fourth pMOS transistor, wherein: the second pMOS transistor drain is coupled to the first node, the third pMOS transistor drain and the fourth pMOS transistor drain are both coupled to the second pMOS transistor source, and the third pMOS transistor source and the fourth pMOS transistor source are both coupled to the supply voltage;
   an input reset line coupled to the first pMOS transistor gate and to the first nMOS transistor gate, wherein the reset line is active low;
   a first inverter, wherein the input of the first inverter is coupled to the first node, and the output of the first inverter is coupled to the second pMOS transistor gate and to the second nMOS transistor gate;
   a bit line (BL) signal to input a first data to be written into the configuration memory latch during write operations, wherein the BL is coupled to the third pMOS transistor gate and to the third nMOS transistor gate;
   an input Word Line Write (WLW) signal, which, when asserted, enables data to be written to the configuration memory latch, wherein the WLW signal is coupled to the fourth pMOS transistor gate and to the fourth nMOS transistor gate; and
   a second inverter, wherein the input of the second inverter is coupled to the first node, and the output of the second inverter drives an output line of the configuration memory latch.

2. The configuration memory latch of claim 1, wherein a new reset cycle is initiated prior to each assertion of WLW, wherein each reset cycle comprises asserting reset followed by de-asserting reset.

3. The configuration memory latch of claim 1, further comprising a word line read (WLR) signal, which, when asserted, enables data to be read from the configuration memory latch.

4. The configuration memory latch of claim 3, wherein a state of the BL, during read operations, is indicative of a data stored in the configuration memory latch.

5. The configuration memory latch of claim 4, further comprising:
   a third pull-down network comprising a fifth nMOS transistor coupled in series to a sixth nMOS transistor, wherein the sixth nMOS transistor gate is coupled to the WLR signal, the sixth nMOS transistor drain is coupled to the BL, and wherein the fifth nMOS transistor source is grounded and the fifth nMOS transistor drain is coupled to the sixth nMOS transistor source.

6. The configuration memory latch of claim 5, further comprising:
   a sensing block, wherein a first input of the sensing block is coupled to a weak pull up on the BL and a second input is of the sensing block is coupled to a read enable signal, wherein the sensing block is configured to sense the state of the BL when the WLR signal and the read enable signal are both asserted.

7. The configuration memory latch of claim 1, wherein:
   the first pull up network further comprises a fifth pMOS transistor, wherein the fifth pMOS transistor source is coupled to the third pMOS transistor drain and to the fourth pMOS transistors drain and, wherein fifth pMOS transistor drain is coupled to the first node;
   the first pull-down network further comprises a fifth nMOS transistor, wherein the fifth nMOS transistor drain is coupled to the second nMOS transistor source and the fifth nMOS transistor source is coupled to the first nMOS transistor drain; and
   a scan mode input, wherein the scan mode input is active low, and wherein the scan mode input is coupled to the fifth pMOS transistor gate and to the fifth nMOS transistor gate, wherein the scan mode input is asserted to place the configuration memory latch in test mode.

8. The configuration memory latch of claim 7, wherein, when the scan mode input is asserted, the BL signal is driven by Automatic Test Pattern Generator (ATPG) tools.

9. The configuration memory latch of claim 8, wherein, when the scan mode input is asserted, the WLW signal is driven by Automatic Test Pattern Generator (ATPG) tools or Automatic Test Equipment.

10. The configuration memory latch of claim 1, wherein the configuration memory latch forms part of a programmable logic device, or a field programmable gate array (FPGA).

11. An integrated circuit (IC) comprising a programmable logic device (PLD), wherein the PLD comprises a configuration memory latch, the configuration memory latch comprising:
    a first pMOS transistor, wherein a first pMOS source of the first pMOS transistor is coupled to a supply voltage and the first pMOS transistor drain is coupled to a first node;
    a first pull-down network comprising a first nMOS transistor in series with a second nMOS transistor, wherein the first nMOS transistor source is coupled to ground (GND) and the second nMOS transistor drain is coupled to the first node;
    a second pull down network in parallel with the first pull-down network, wherein the second pull-down network comprises a third nMOS transistor in series with a fourth nMOS transistor, wherein the third nMOS transistor source is coupled to ground and the fourth nMOS transistor drain is coupled to the first node;
    a first pull up network, wherein the first pull up network comprises a second pMOS transistor, a third pMOS transistor, and a fourth pMOS transistor, wherein: the second pMOS transistor drain is coupled to the first node, the third pMOS transistor drain and the fourth pMOS transistor drain are both coupled to the second pMOS transistor source, and the third pMOS transistor source and the fourth pMOS transistor source are both coupled to the supply voltage;

an input reset line coupled to the first pMOS transistor gate and to the first nMOS transistor gate, wherein the reset line is active low;

a first inverter, wherein the input of the first inverter is coupled to the first node, and the output of the first inverter is coupled to the second pMOS transistor gate and to the second nMOS transistor gate;

a bit line (BL) signal to input a first data to be written into the configuration memory latch during write operations, wherein the BL is coupled to the third pMOS transistor gate and to the third nMOS transistor gate;

an input Word Line Write (WLW) signal, which, when asserted, enables data to be written to the configuration memory latch, wherein the WLW signal is coupled to the fourth pMOS transistor gate and to the fourth nMOS transistor gate; and a second inverter, wherein the input of the second inverter is coupled to the first node, and the output of the second inverter drives an output line of the configuration memory latch.

12. The IC of claim 11, wherein a new reset cycle is initiated prior to each assertion of WLW, wherein each reset cycle comprises asserting reset followed by de-asserting reset.

13. The IC of claim 11, further comprising a word line read (WLR) signal, which, when asserted, enables data to be read from the configuration memory latch.

14. The IC of claim 13, wherein a state of the BL, during read operations, is indicative of a data stored in the configuration memory latch.

15. The IC of claim 14, further comprising:
a third pull-down network comprising a fifth nMOS transistor coupled in series to a sixth nMOS transistor, wherein the sixth nMOS transistor gate is coupled to the WLR signal, the sixth nMOS transistor drain is coupled to the BL, and wherein the fifth nMOS transistor source is grounded and the fifth nMOS transistor drain is coupled to the sixth nMOS transistor source.

16. The IC of claim 15, further comprising:
a sensing block, wherein a first input of the sensing block is coupled to a weak pull up on the BL and a second input is of the sensing block is coupled to a read enable signal, wherein the sensing block is configured to sense the state of the BL when the WLR signal and the read enable signal are both asserted.

17. The IC of claim 11, wherein:
the first pull up network further comprises a fifth pMOS transistor, wherein the fifth pMOS transistor source is coupled to the third pMOS transistor drain and to the fourth pMOS transistors drain and, wherein fifth pMOS transistor drain is coupled to the first node;

the first pull-down network further comprises a fifth nMOS transistor, wherein the fifth nMOS transistor drain is coupled to the second nMOS transistor source and the fifth nMOS transistor source is coupled to the first nMOS transistor drain; and a scan mode input, wherein the scan mode input is active low, and wherein the scan mode input is coupled to the fifth pMOS transistor gate and to the fifth nMOS transistor gate, wherein the scan mode input is asserted to place the configuration memory latch in test mode.

18. The IC of claim 17, wherein, when the scan mode input is asserted, the BL signal is driven by Automatic Test Pattern Generator (ATPG) tools.

19. The IC of claim 18, wherein, when the scan mode input is asserted, the WLW signal is driven by Automatic Test Pattern Generator (ATPG) tools or Automatic Test Equipment (ATE).

20. The IC of claim 19, wherein, when the scan mode input is asserted:
BL data flows through to output when WLW is asserted, and
output is maintained at logic 0, when WLW is de-asserted.

* * * * *